(12) United States Patent
Miller et al.

(10) Patent No.: US 11,436,425 B2
(45) Date of Patent: *Sep. 6, 2022

(54) RUGGEDIZED TRIGGERING HANDLE WITH MODULAR PERIPHERAL CONTROL SYSTEM

(71) Applicant: MobileDemand LC, Hiawatha, IA (US)

(72) Inventors: Matthew Miller, Cedar Rapids, IA (US); Steven R. Kunert, Cedar Rapids, IA (US); Kraig D. Brody, Cedar Rapids, IA (US)

(73) Assignee: MOBILEDEMAND LC, Hiawatha, IA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/188,864

(22) Filed: Mar. 1, 2021

(65) Prior Publication Data

US 2021/0256233 A1    Aug. 19, 2021

Related U.S. Application Data

(63) Continuation-in-part of application No. 15/833,815, filed on Dec. 6, 2017, now Pat. No. 10,936,002.

(60) Provisional application No. 62/430,710, filed on Dec. 6, 2016.

(51) Int. Cl.
*G06K 7/10* (2006.01)
*G06F 1/16* (2006.01)
*H05K 5/02* (2006.01)

(52) U.S. Cl.
CPC ....... *G06K 7/10881* (2013.01); *G06F 1/1632* (2013.01); *G06F 1/1656* (2013.01); *G06F 1/1698* (2013.01); *H05K 5/023* (2013.01)

(58) Field of Classification Search
CPC .......... G06K 7/10881; G06K 7/10386; G06K 17/0025; G06Q 20/32
USPC ............. 235/472.02, 462.45, 462.46, 472.01
See application file for complete search history.

(56) References Cited

U.S. PATENT DOCUMENTS

| 4,845,699 | A | * | 7/1989 | Kawasaki | ............ | G11B 7/0932 |
| | | | | | | 369/44.22 |
| 5,514,861 | A | * | 5/1996 | Swartz | .................... | G06F 1/163 |
| | | | | | | 235/462.44 |
| 8,856,033 | B2 | | 10/2014 | Hicks et al. | | |
| 9,558,482 | B2 | | 1/2017 | Hicks et al. | | |
| 10,936,002 | B1 | | 3/2021 | Miller et al. | | |

(Continued)

*Primary Examiner* — Daniel St Cyr
(74) *Attorney, Agent, or Firm* — Suiter Swantz pc llo

(57) ABSTRACT

A ruggedized triggering handle device for a mobile scanning system supports a mobile device (tablet, smartphone) attachable by a bracket on the upper surface of the handle. The handle may establish a wireless link to the mobile device; a trigger of the handle device includes a magnetic switch which, when driven proximate to a triggering element enclosed within the handle, causes the triggering element to transmit key codes and instructions via the wireless link, enabling the user to trigger applications and peripheral sensing components (e.g., readers, scanners, imagers) of or proximate to the mobile device via the handle. The peripheral sensing components may be modular elements attachable between the upper and lower portions of the handle device, either individually or serially as needed, and operable via the trigger or the additional buttons without the need for visual reference to the handle.

7 Claims, 19 Drawing Sheets

(56) References Cited

U.S. PATENT DOCUMENTS

| | | | |
|---|---|---|---|
| 2003/0059051 A1* | 3/2003 | Hatano | H04L 63/0428 |
| | | | 380/270 |
| 2007/0030128 A1 | 2/2007 | Hills et al. | |
| 2011/0080414 A1* | 4/2011 | Wang | G06K 7/10722 |
| | | | 345/502 |
| 2012/0315845 A1* | 12/2012 | Buczek | H04M 1/7253 |
| | | | 455/41.1 |
| 2017/0140363 A1 | 5/2017 | Hicks et al. | |
| 2019/0014890 A1* | 1/2019 | Li | A45C 11/00 |
| 2019/0392184 A1* | 12/2019 | Codato | G06K 7/10881 |

\* cited by examiner

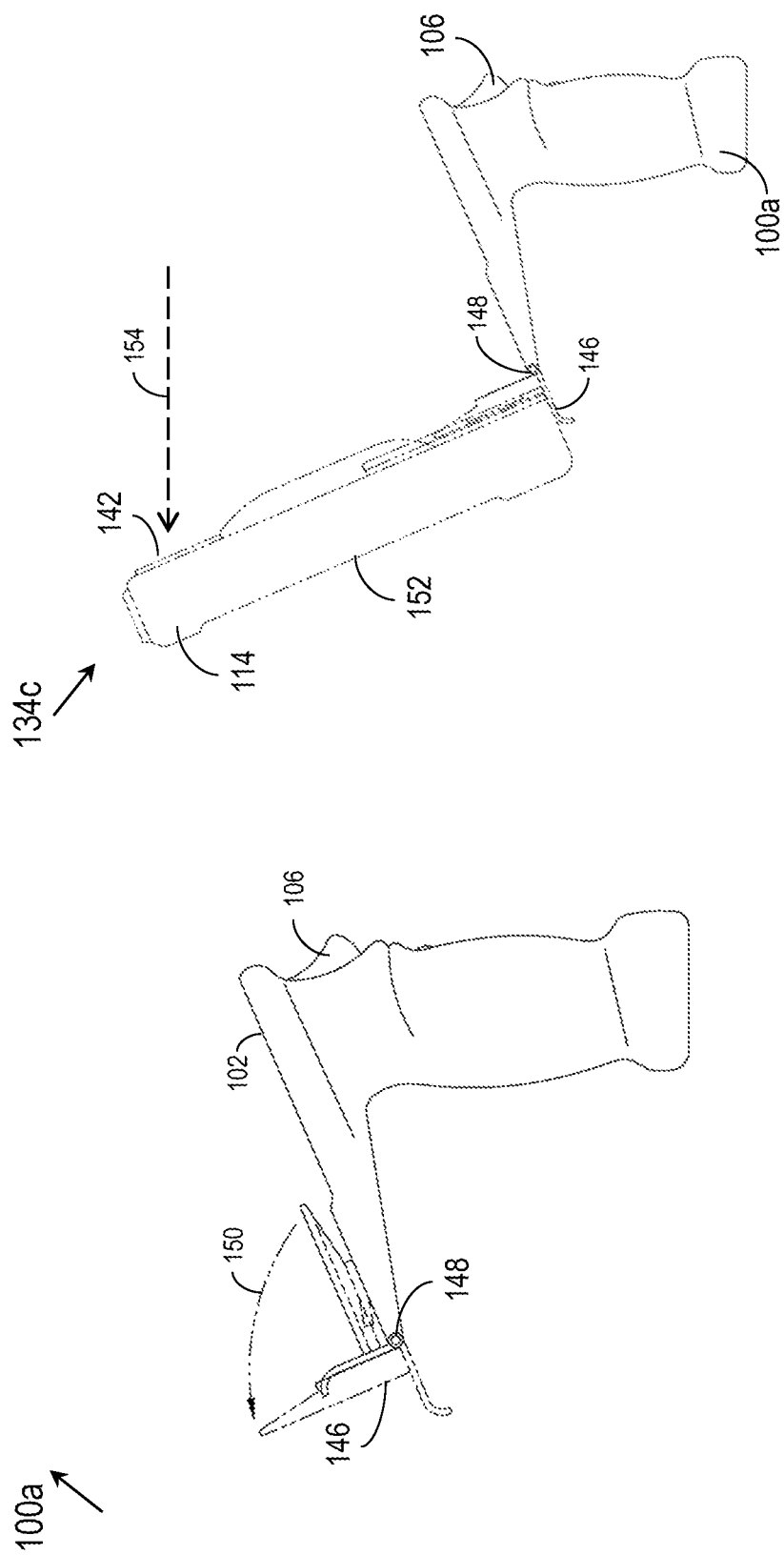

RUGGEDIZED TRIGGERING HANDLE WITH MODULAR PERIPHERAL CONTROL SYSTEM

CROSS-REFERENCE TO RELATED APPLICATIONS

The present application is related to and claims the benefit of the earliest available effective filing dates from the following listed applications (the "Related Applications") (e.g., claims earliest available priority dates for other than provisional patent applications (e.g., under 35 USC § 120 as a continuation in part) or claims benefits under 35 USC § 119(e) for provisional patent applications, for any and all parent, grandparent, great-grandparent, etc. applications of the Related Applications).

RELATED APPLICATIONS

U.S. patent application Ser. No. 15/833,815 entitled RUGGEDIZED TRIGGERING HANDLE FOR MOBILE SCANNING SYSTEM and filed Dec. 6, 2017, which application issued Mar. 2, 2021 as U.S. Pat. No. 10,936,002;

U.S. Provisional Patent Application Ser. No. 62/430,710 entitled RUGGEDIZED TRIGGERING HANDLE FOR MOBILE SCANNING SYSTEM and filed Dec. 6, 2016;

Said U.S. patent application Ser. No. 15/833,815 and 62/430,710 are herein incorporated by reference in their entirety.

BACKGROUND

Tablets, portable computing devices, multifunction smartphones, and other such mobile devices with peripheral components embedded in their edges or faces (e.g., scanners, cameras, imagers) may not be ideally configured for one-handed use of these peripherals, especially if the mobile device is partially or fully housed in a protective casing. Such a protective casing shields the mobile device from extreme temperatures and pressures, moisture, or impacts that might otherwise cause damage or hinder the operation of the device. Further, the mobile device may include a strap or handle to allow a user to support the mobile device with one hand while operating its touchscreen with the other hand. However, protective casings may add dimension and weight to the mobile device, and may interfere with the straps or handles (if, for example, the handles require a physical connection to a port of the mobile device). The handles may still require the user to support the mobile device with one hand and operate applications and peripherals (e.g., via a touchscreen of the mobile device) with the other hand. Finally, some mobile devices may not incorporate built-in peripherals, requiring the attachment of discrete scanning or imaging modules to the mobile device, or to the protective casing, to achieve the desired functionality; establishing a physical datalink between the module and the mobile device may add still more bulk or complexity

SUMMARY

Embodiments of the inventive concepts disclosed herein are directed to a ruggedized triggering handle device for a mobile scanning system supports a mobile device (tablet, smartphone) attachable by a bracket on the upper surface of the handle. The handle may establish a wireless link to the mobile device; a trigger of the handle device includes a magnetic switch which, when driven proximate to a triggering element enclosed within the handle, causes the triggering element to transmit key codes and instructions via the wireless link, enabling the user to trigger applications and peripheral sensing components (e.g., readers, scanners, imagers) of or proximate to the mobile device via the handle. The peripheral sensing components may be modular elements attachable between the upper and lower portions of the handle device, either individually or serially as needed, and operable via the trigger or the additional buttons without the need for visual reference to the handle.

In a first aspect, embodiments of the inventive concepts disclosed herein are directed to a ruggedized handle device for a modular mobile sensing system. In embodiments, the handle device has an outer shell or housing contoured to a user's hand and fashioned of a high impact material. The outer shell has an upper portion terminating in a top surface and a lower portion terminating in a bottom surface, and encloses an inner shell fashioned of the same high impact material. The upper and lower portions are physically attachable and detachable via physical connectors; one or more modular peripheral sensing devices (e.g., scanners, readers, imagers) may be attached between the upper and lower portions and operated via the handle device. The top surface of the upper portion may include a cradle, bracket, or like docking component for securely supporting a mobile computing, communications, or scanning device attachable to the handle device. The handle device includes a memory enclosed within the outer shell for storing encoded instruction sets or key codes associated with particular applications or peripheral devices (e.g., cameras, scanners, imagers) of the mobile device. The handle device includes a triggering element enclosed by the inner shell. The triggering element may establish a wireless link between the handle device and mobile device, and transmit particular stored key codes or instruction sets to the mobile device, activating the associated applications or peripherals, when the handle device is in an active state. The handle device includes a trigger corresponding to the user's index finger; actuation of the trigger thereby drives a magnetic switch or element proximate to the triggering element, initiating the active state. The handle device includes one or more light emitting diodes (LED) or similar luminous elements for indicating the active state or the status of the wireless link.

In some embodiments, the modular peripheral sensing components include, but are not limited to: imaging devices (2D or 3D/IR); barcode scanners; card readers (e.g., magnetic stripe and/or integrated circuit chip); LED illuminators for lighting the area around the handle device or an area of the user's choosing; or RFID tag readers.

In some embodiments, supported mobile computing devices include, but are not limited to, tablets, smartphones, phablets, and other portable computing devices.

In some embodiments, the lower portion of the handle device includes auxiliary buttons operable by the thumb or other fingers of the hand using the device (e.g., devices may be configured for right-hand or left-hand use), the auxiliary buttons set into recesses in the outer shell and oriented for use by specific fingers, the recesses capable of supporting the corresponding fingers when the buttons are not in use.

In some embodiments, the trigger includes a magnetic element having a default or resting position within the outer shell and an active position closer to the triggering element, such that actuation of the trigger initiates the active state of the trigger by moving the magnetic element toward the triggering element.

In some embodiments, the trigger is capable of an intermediate position between the default and active positions, such that holding the trigger in the intermediate position for a particular duration may transmit key codes or commands to the mobile device or peripheral sensing components other than those associated with the default and active positions.

BRIEF DESCRIPTION OF THE FIGURES

FIG. 5A is a right-side view of a triggering handle according to the inventive concepts disclosed herein; and FIG. 5B is a right-side view of a system including the mobile device of FIG. 2A and the triggering handle of FIG. 5A;

DETAILED DESCRIPTION OF EXEMPLARY EMBODIMENTS

Figure 1:
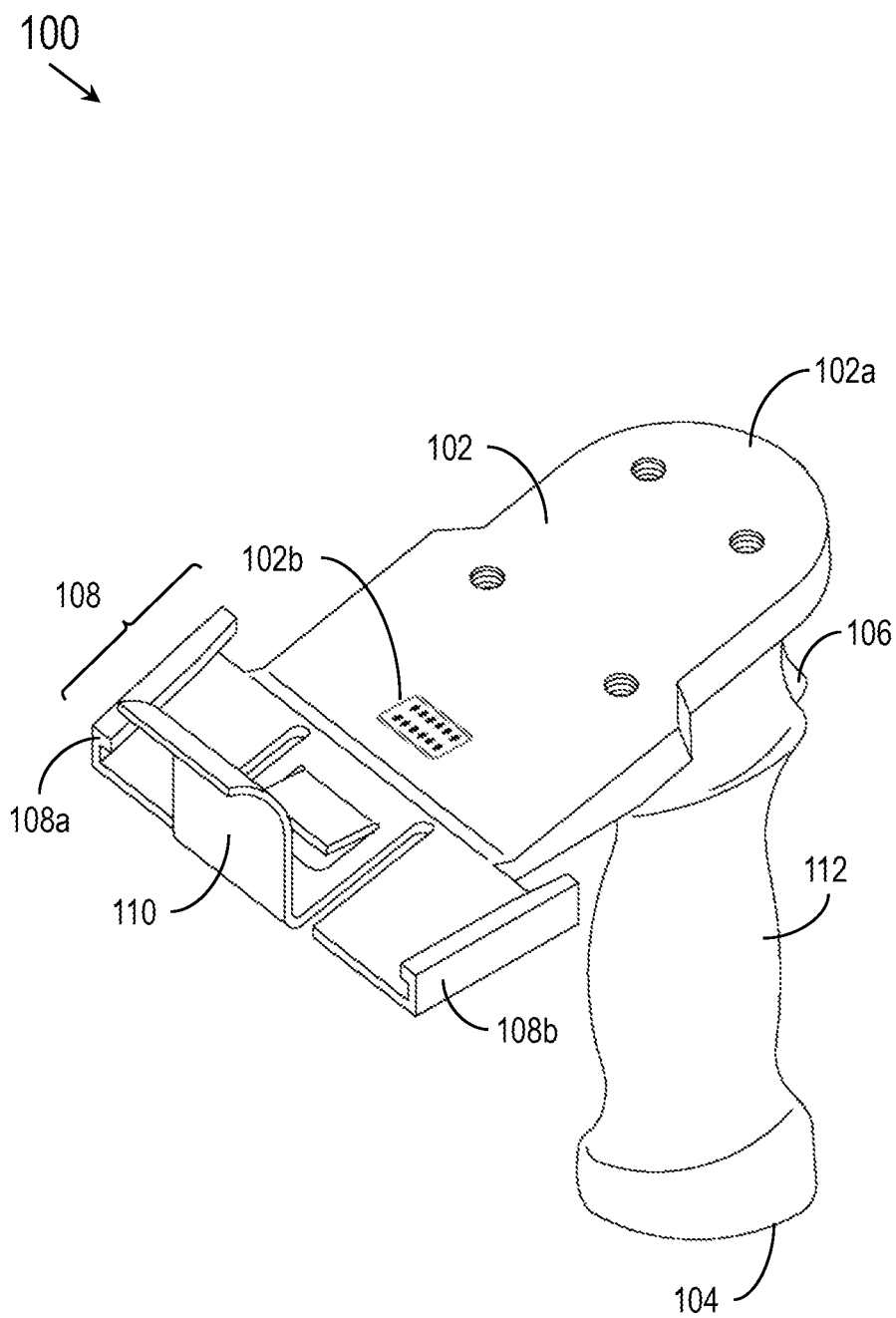
FIG. 1 is an overhead perspective view of a triggering handle according to embodiments of the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1 b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a' and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a ruggedized triggering handle physically attachable, and wirelessly connectible, to a mobile device which may be housed in a protective casing. The triggering handle may allow a user to securely support the mobile device in one hand (whether the user is right- or left-handed) while "aiming" the device in such a way that one or more peripherals or applications may be activated with the same supporting hand, via the triggering handle. The triggering handle may be configured or programmed to activate specific applications or peripherals via specific actuations (or actuation sequences) of the trigger or of other buttons dedicated to specific fingers of the supporting hand. In this way, the triggering handle may link to a mobile device and execute multiple, repetitive, or varied applications of the mobile device via the single supporting hand and without the need for visual reference to the handle.

Referring to FIG. 1, a triggering handle 100 according to embodiments of the inventive concepts disclosed herein may include an upper portion terminating in a top surface 102, a lower portion terminating in a bottom surface 104, a trigger 106, an attachment bracket 108 (e.g., docking component), and a release tab 110.

The triggering handle 100 may be formed of enterprise-grade rigid high-impact plastic or any similar durable, lightweight material. The exterior of the triggering handle 100 may include an outer shell (112) and an inner shell enclosed within the outer shell (the outer shell being at least partially hollow so as to enclose components of the triggering handle), such that a triggering element may be situated within a sealed weather-resistant internal area defined by the inner shell, which may be fashioned of the same material as the outer shell. In some embodiments, the triggering handle 100 may be rated at least IP65 (dust-tight and resistant to water jets). The attachment bracket 108 may be configured to be removably attached to the rear face of a suitably equipped mobile device (e.g., a mobile communications or computing device such as a smartphone, tablet, or phablet). For example, the attachment bracket 108 may include one or more grooves 108a, 108b configured to slidably interact with matching tabs on the rear face of the mobile device (or a corresponding attachment component incorporated into, or attached to, the mobile device). In this way, the triggering handle 100 may be intuitively attached to the mobile device such that the mobile device may be "pointed" or "aimed" at a desired target by a user grasping the mobile device via the triggering handle 100. The triggering handle 100 may be detached from a mobile device via the release tab 110. In some embodiments, the top surface 102 may include surface contacts 102b (e.g., pogo pins, spring pins) configured to directly interface with a suitably equipped tablet, smartphone, or other like mobile device (rather than linking wirelessly to the mobile device, e.g., via Bluetooth or a similar wireless protocol).

Figure 2A:
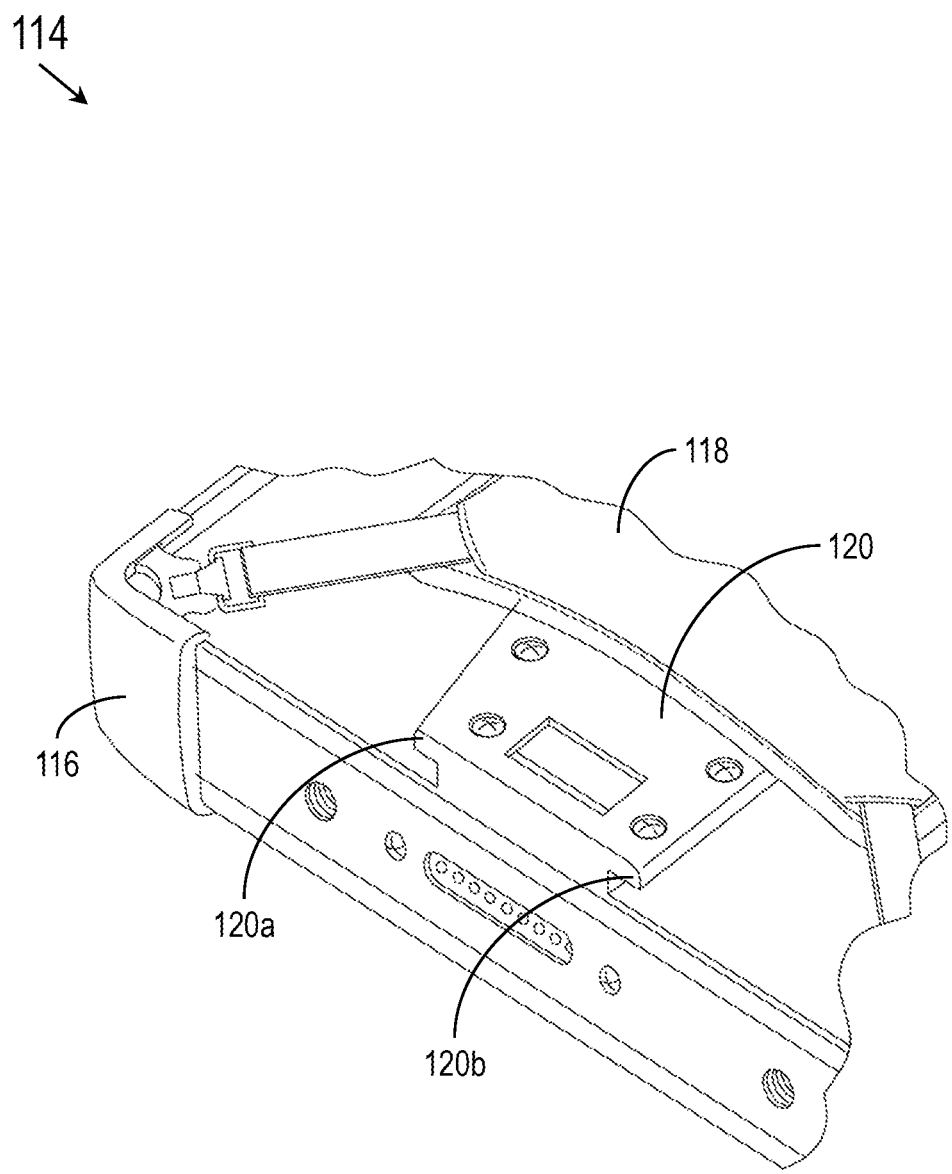
FIGS. 2A and 2B illustrate the attachment of the triggering handle of FIG. 1 to a mobile device according to the inventive concepts disclosed herein.
Figure 2B:
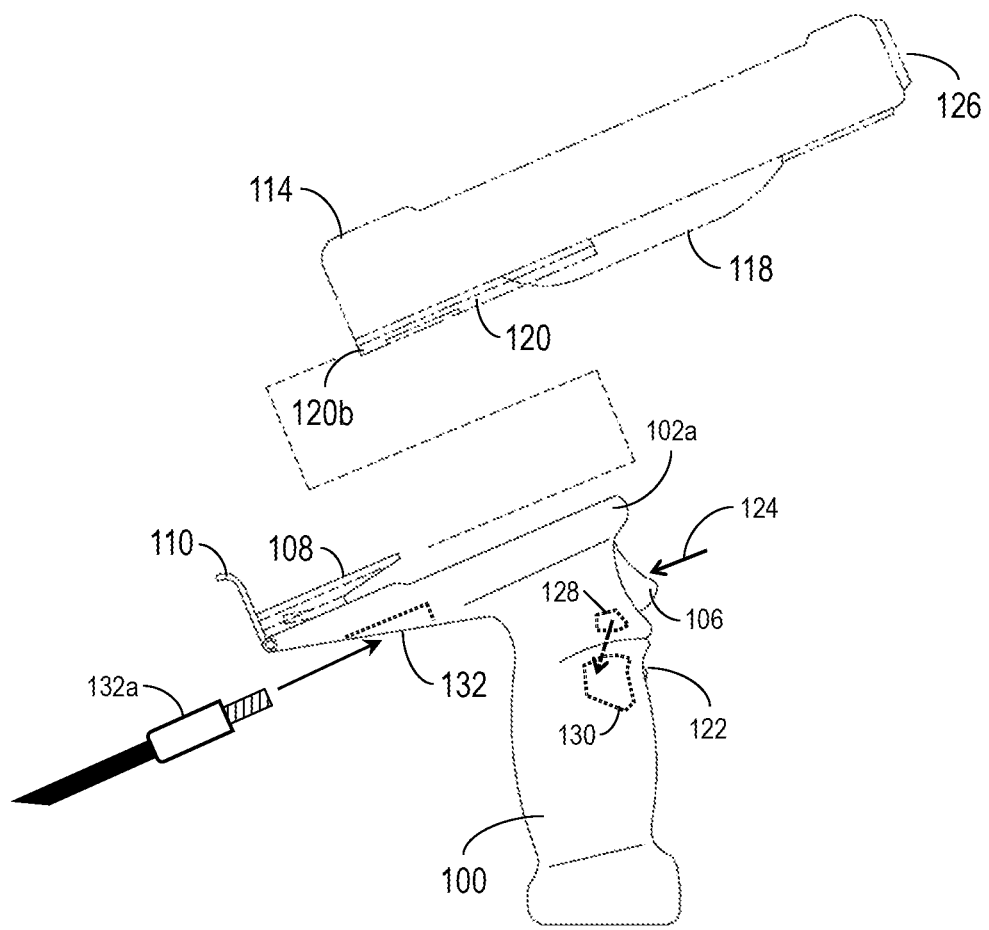

Referring also to FIGS. 2A and 2B, a mobile device 114 may be encased in a protective casing including reinforced corners (116) and/or a carrying strap (118), which the attachment of the mobile device 114 to the triggering handle 100 may accommodate. The top surface 102 of the triggering handle 100 may be configured to accommodate the carrying strap 118 such that the carrying strap need not be removed or detached from the mobile device 114 in order to physically attach the triggering handle 100. For example, the dorsal face of the mobile device 114 (e.g., the face opposite the display surface of the mobile device and proximate to the top surface 102 of the triggering handle 100) may include an attachment plate 120. The attachment plate 120 may include left and right tabs 120a, 120b compatible with the grooves (108a, 108b, FIG. 1) of the attachment bracket 108 of the triggering handle 100.

The top surface 102 may partially support the mobile device 114 in place once the mobile device is physically attached to the triggering handle 100. The bottom surface 104 may be configured to support the triggering handle 100 in a stable level state on a flat surface whether or not the triggering handle is physically connected to the mobile device 114.

Referring in particular to FIG. 2B, the mobile device 114 may slidably attach to the triggering handle 100, the tabs (120b) of the attachment plate 120 sliding into the grooves (108b) of the attachment bracket 108 until the mobile device 114 is secured in place by the release tab 110. The triggering handle 100 may include one or more luminous elements, such as an LED 122 or similar indicator, configured to indicate a current state of the handle. For example, when the triggering handle 100 is attached to a mobile device 114, the triggering handle 100 may attempt to establish a wireless link to the mobile device 114 (e.g., via Bluetooth or any appropriate similar wireless protocol). The LED 122 may blink on and off during this process, changing to a solid "on" state once a connection has been established. For example, once the triggering handle 100 is attached and linked to the mobile device 114, a user may actuate or activate (124) the trigger 106 in order to "wake up" a mobile device 114 currently set to a "sleep" mode.

One or more desired peripheral components (126) of the mobile device 114, such as a barcode scanner or imager (e.g., 2D cameras, 3D/infrared (IR) imagers and imaging systems), may align with the triggering handle 100, such that the desired peripheral 126 is positioned directly above the front (102a) of the top surface 102. Any object at which the user points while grasping the triggering handle 100 may thus be scanned, or its image captured, by the desired peripheral 126, the target object being within the field of vision (FOV) of the peripheral. The desired peripheral 126 (or, e.g., a software application configured to execute on processors of the mobile device 114) may be activated by pressing the trigger 106, e.g., with the user's index finger.

For example, an actuation (124) of the trigger 106 may articulate a small magnetic element 128 (e.g., magnetic switch) embedded in the end of the trigger. The magnetic element 128 or magnetic switch may include, for example, a solid-state switch or magnet capable of detection by a Hall effect or similar magnetic-field sensor within, or proximate to, a triggering element 130. The triggering element 130 (e.g., wireless transmitter/receiver) may be sealed within the inner shell of the triggering handle 100 to protect the triggering element from damage due to moisture, wind, or shock. The triggering element 130 may be positioned just outside a predetermined proximate range from to the end of the trigger 106 containing the magnetic element 128. If the magnetic element 128 is brought proximate to the triggering element 130 by actuation (124) of the trigger, an active trigger state (e.g., active state of the triggering handle) may commence. In the event of an active trigger state, one or more key codes (e.g., encoded instructions or instruction sets) may be wirelessly transmitted from the triggering handle 100 to the linked mobile device 114. The mobile device 114 may include software configured to initiate specific actions of the mobile device 114, or of its peripheral components 126, upon the receipt of a particular key code. For example, key codes may be programmed to activate the peripheral devices 126 or components of the mobile device 114, e.g., a barcode scanner, a camera, or a 3D imager. A transmitted key code, or combination of key codes, may additionally activate software installed on the mobile device 114 and configured to operate in conjunction with the activated peripherals 126, such as a volume dimensioning system of the mobile device 114 configured to receive and process input received from a 3D imager. For example, a 3D imager may be activated to capture imagery associated with a package or parcel; the volume dimensioning system may assess the dimensions of the parcel. A barcode scanner may determine shipping or handling information of the parcel based on detecting and decoding data encoded on the exterior of the parcel, such as a barcode or QR code. The triggering handle 100 may include additional internal circuitry such as a USB port 132 (or any appropriate similar communications port) capable of receiving a USB cable 132a (or like cable compatible with the connection port) and thereby charging internal batteries of the triggering handle.

Figure 3A:
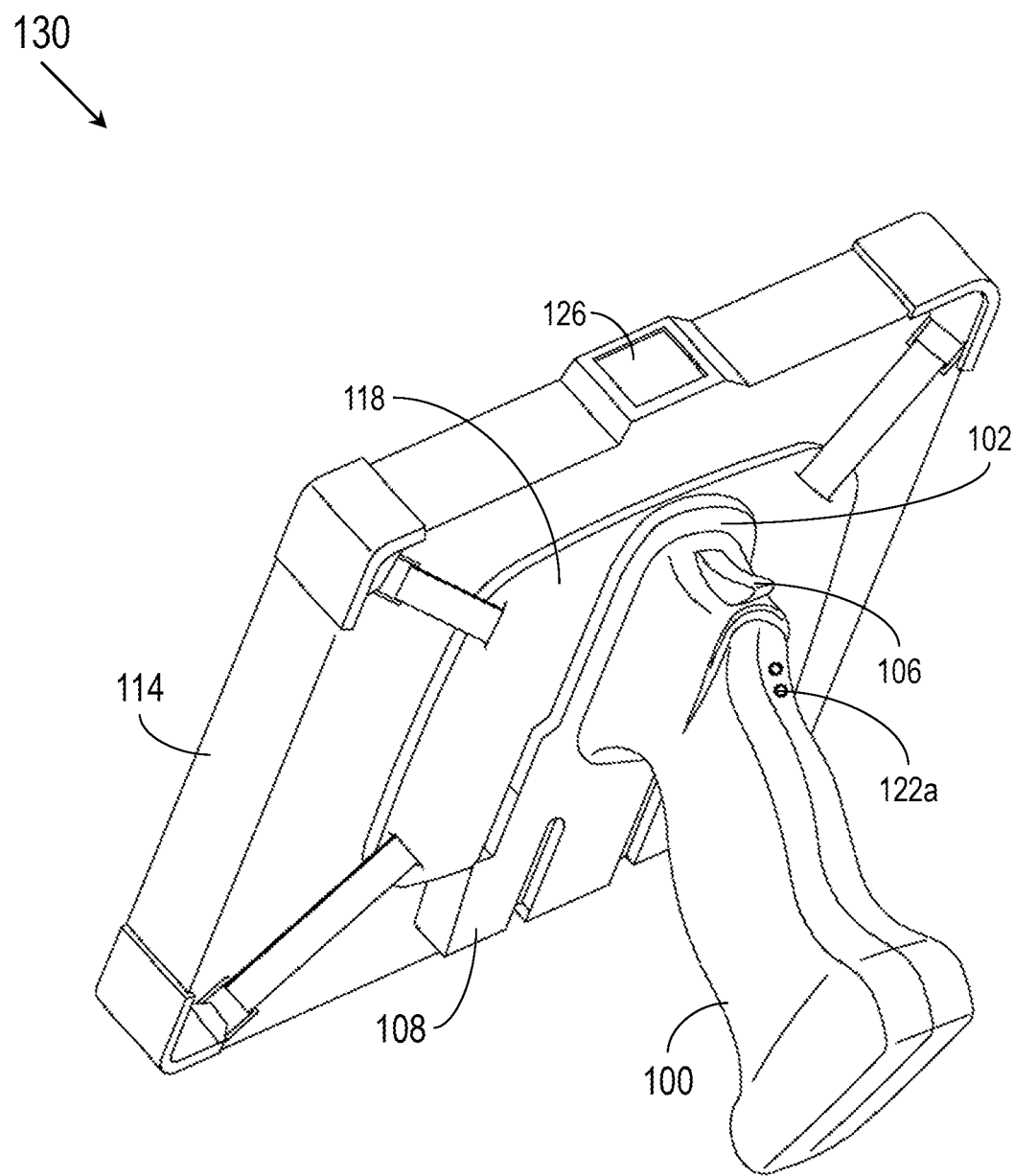
FIG. 3A is a right-side low-angle view of a system including the triggering handle of FIG. 1 and the mobile device of FIG. 2A.
Figure 3B:
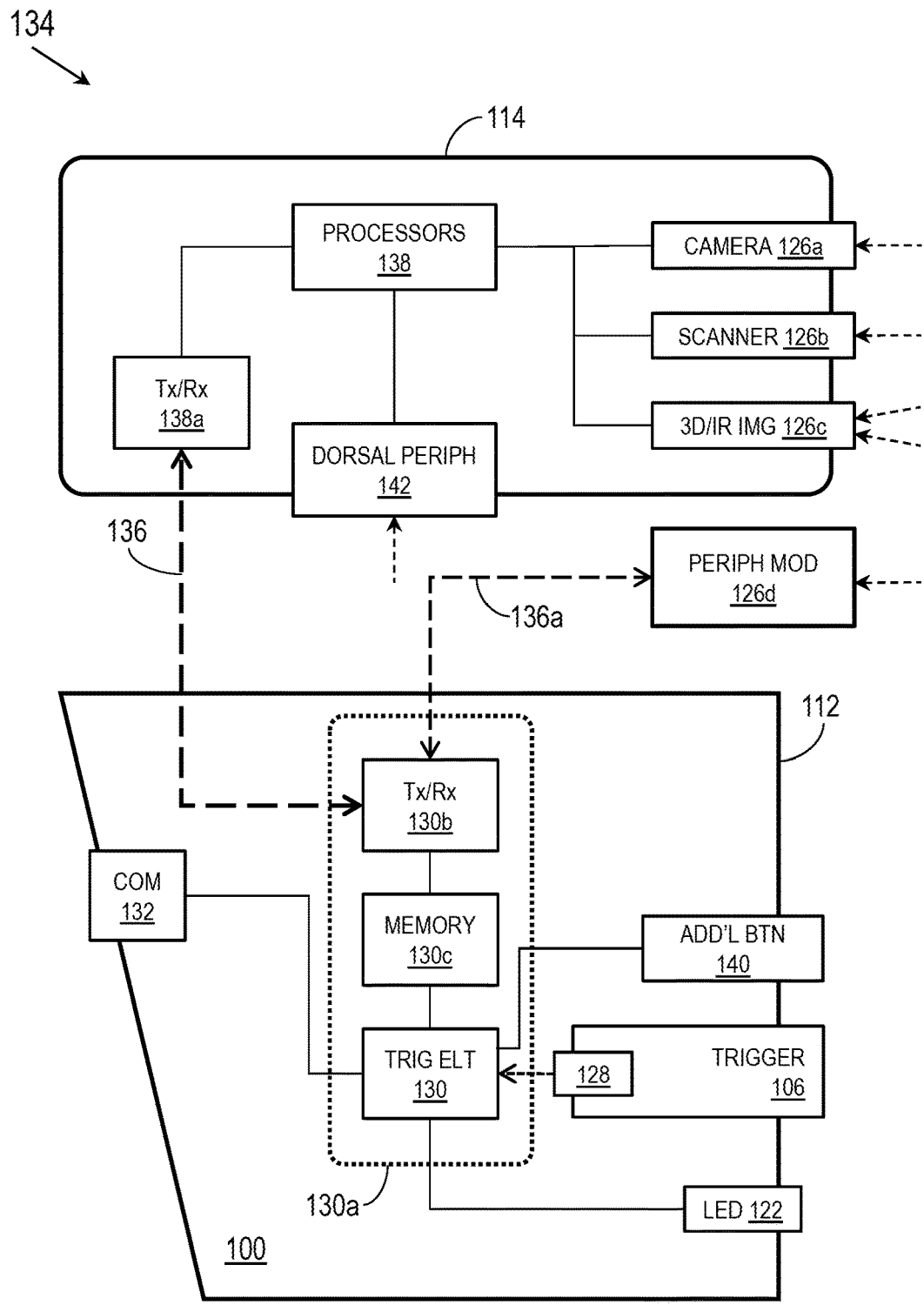
FIG. 3B is a diagrammatic illustration of the system of FIG. 3A.

Referring to FIGS. 3A and 3B, a system 134 according to embodiments of the inventive concepts disclosed herein may include the triggering handle 100 of FIG. 1 physically attached to, and wirelessly linked to, the mobile device 114 of FIGS. 2A-B.

In some embodiments, the triggering handle 100 may include an additional luminous element or LED (122a) for indicating an active trigger state (e.g., the light is "on" when the trigger 106 is pressed), an attempt to wirelessly link the triggering handle 100 to the mobile device 114, or a successfully established wireless link (136) between the triggering handle and mobile device. An active trigger state may cause the triggering element 130 (enclosed within the inner shell, 130a) to transmit (130b) to the mobile device 114 key codes or instructions for executing a predetermined keyboard sequence associated with the activation of a particular component or peripheral (126) or application associated with the peripheral 126 (e.g., activating a 2D camera 126a or barcode scanner 126b, or commencing a volume dimensioning process by activating a 3D imager 126c). The mobile device 114 may communicate the successful triggering of the desired peripheral 126a-c or application via audio prompts or a tone specific to the triggered peripheral or application.

Key codes and instructions transmitted by the triggering handle 100 to the mobile device 114 may be stored to a memory 130c of (or proximate to) the triggering element 130. For example, the memory 130c may include Flash memory, solid-state memory, electrically erasable programmable read-only memory (EEPROM), or any appropriate similar memory capable of storing and erasing the encoded key codes and instructions. The key codes and instructions may be assembled or determined by a user of the system 134 via the mobile device 114 (which may include onboard processors 138) and sent (138a) to the triggering handle 100 via wireless link (136), thereby "initializing" or "configuring" the triggering handle 100 for control of the mobile device or its peripherals 126a-c. For example, in response to an actuation of the trigger 106 (or a combination of a trigger actuation with actuations of additional buttons (140)), events associated with the mobile device 114 may include: activation of a camera 132a, barcode scanner 132b, or 3D/IR imager 132c; interfacing with another peripheral, such as a dorsally incorporated peripheral (142) mounted to the dorsal face (e.g., underside, face opposite the display screen) of the mobile device 114; launching or deactivating additional software applications; and incrementing a counter (e.g., trackable and displayable by the mobile device). Software executing on the mobile device 114 may include a configuration interface providing for the unique mapping of specific actuations (124) or sequences of actuations of the trigger 106 and additional buttons 140 to the desired applications or peripherals 126a-c activated in response.

The processors 138 of the mobile device 114 may include software configured to execute on the mobile device 114 based on key codes and instructions received from the triggering handle 100 (e.g., user applications or system services/processes). For example, the software may monitor the wireless link 136, processing events as the key codes are received from the triggering handle 100. The key codes may include, e.g., key press/release events processed as hotkey events by the mobile device 114. Similarly, the triggering handle 100 may function as a serial-connected device via the COM port (132) for serial emulation via USB or Bluetooth. Alternatively, the triggering handle 100 may function as a USB-connected Human Interface Device (USB-HID), sending HID event codes over a physical USB link via the COM port 132; the mobile device 114 may process events specific to the particular HID device type.

The triggering handle 100 may alternatively or additionally wirelessly link to (136a), and operate in conjunction with, a remote peripheral module 126d. For example, the remote peripheral module 126d may be mechanically or physically attached to the mobile device 114 or its protective housing (e.g., via screws, bolts, or other removable or permanent fasteners), but not operatively or logically connected to the mobile device in any way.

Figure 4A:
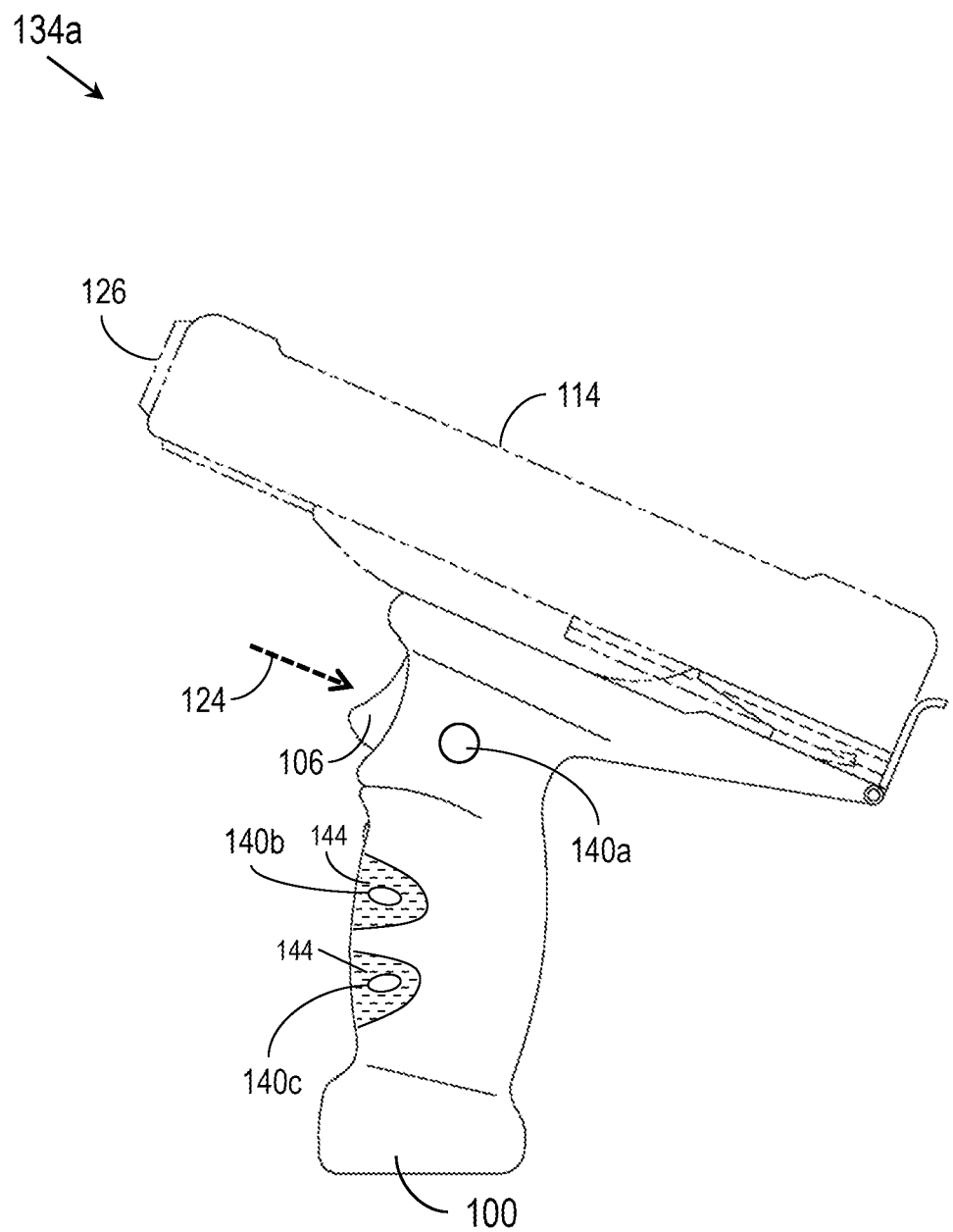
FIG. 4A is a left-side view of the system of FIG. 3A.

Referring to FIG. 4A, the system 134a may be implemented and may function similarly to the system 134 of FIG. 3A, except that the triggering handle 100 of the system 134a may be contoured and configured for left-hand or right-hand use, or for ambidextrous use by either hand. For example, the triggering handle 100 may be contoured or augmented with additional padding or cushioning material (not shown) to fit either the left or right hand and configured such that the trigger 106 may be actuated (124) with the index finger of the hand (left or right) currently grasping the triggering handle. Additional buttons (140, FIG. 3B) of triggering handle 100 may include a thumb button 140a configured for actuation by the thumb of the hand holding the triggering handle 100 and recessed buttons 140b-c configured for actuation by non-index fingers of the hand (the index finger reserved for actuation of the trigger 106).

For example, the thumb button 140a which may be programmed to activate additional peripherals or applications of the mobile device 114 when activated (e.g., apart from those configured for activation in response to an actuation 124 of the trigger 106). As shown by FIG. 4A, the thumb button 140a may be positioned on the upper left side of the triggering handle 100 to facilitate rapid actuation of the thumb button with the right thumb (e.g., without the need to visually locate the thumb button). For example, if the trigger 106 activates a peripheral 126 of the mobile device 114 (e.g., barcode scanner (126b, FIG. 3B)), the thumb button 140a may cause the mobile device to transmit the scanned information, e.g., to one or more preprogrammed remote users. In some embodiments, the thumb button 140a may function as a "reset button" for refreshing a wireless link (136, FIG. 3B) to the mobile device 114, e.g., if said mobile device is in a "sleep" or hibernation mode.

Similarly, the recessed buttons 140b-c may be positioned and programmed/configured to activate additional peripherals or applications of the mobile device 114 in response to actuation by other fingers of the hand holding the triggering handle 100. For example, as shown by FIG. 4A, the recessed buttons 140b-c may be positioned for rapid actuation by the middle and ring fingers of the right hand respectively. Similarly, the key codes or encoded instructions stored to the memory (130c, FIG. 3B) may include specific codes or instructions dedicated to the thumb button 140a and recessed buttons 140b-c. The recessed buttons 140b-c (as well as the thumb button 140a) may be surrounded by dedicated recesses (144) set into the outer shell (112, FIG. 1). For example, the recesses 144 may be textured so that the user may quickly match the appropriate fingers to their corresponding recessed buttons 140b-c without looking at the triggering handle 100. Similarly, the recesses 144 may be sized and shaped to allow the corresponding fingers to rest in or on the recesses, quickly actuating the appropriate recessed buttons 140b-c when desired without inadvertently actuating the wrong recessed buttons.

Figure 4B:
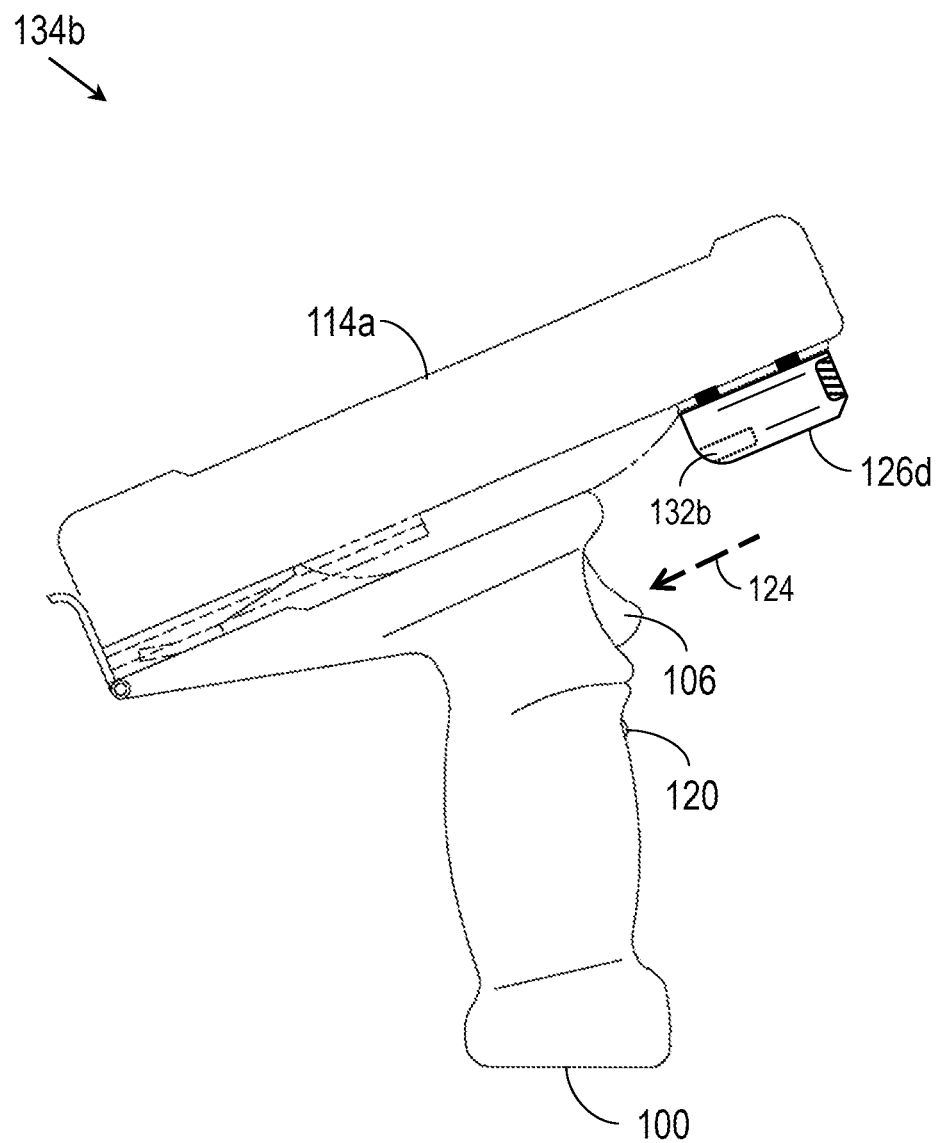
FIG. 4B is a right-side view of the system of FIG. 4A.

Referring to FIG. 4B, the system 134b may be implemented and may function similarly to the system 134a of FIG. 4A, except that the system 134b may include a remote peripheral module 126d mechanically or physically attached to a mobile device 114a or to its protective case/housing (e.g., bolted, screwed, fastened) and aligned with the triggering handle 100, e.g., oriented so as to be operable by grasping the triggering handle and pointing the system 134b in the appropriate direction.

However, the remote peripheral module 126d may not be logically or operatively connected to, or controlled by, the mobile device (e.g., via physical data link). For example, the remote peripheral module 126d may include (but is not limited to) a barcode scanner, fingerprint scanner, 2D/visible-light camera, or 3D/IR imager, independently powered by a self-contained battery or power source (e.g., a capacitive power source able to rapidly recharge via USB port (132b)). The remote peripheral module 126d may not be electronically linked to the mobile device 114a yet sufficiently proximate to the triggering handle 100 that the remote peripheral module may be configurable (e.g., via a triggering handle software interface application executing on the mobile device 114a, or via Bluetooth Low Energy (BLE) or any appropriate similar short-range wireless protocol) for remote activation (e.g., via by actuation (124) of the trigger 106) by key codes or instructions transmitted by the triggering handle.

Referring to FIGS. 5A and 5B, the triggering handle 100a may be implemented and may function similarly to the triggering handle 100 of FIG. 1, except that the triggering handle 100a may include a hinged attachment bracket 146. The hinged attachment bracket 146 may be implemented and may function similarly to the attachment bracket 108 of FIG. 1, except that the hinged attachment bracket 146 may include a hinge 148 configured to pivot or rotate the hinged attachment bracket "upward" (150; e.g., toward the user, orthogonal to a line of sight of a forward-oriented peripheral (126b, FIG. 4A) aligned with the top surface 102 and trigger 106 of the triggering handle 100a)) through a continuous arc of substantially 90 degrees.

Referring in particular to FIG. 5B, the system 134c may be implemented and may operate similarly to the systems 134a-b of FIGS. 4A-B, except that the mobile device 114 of the system 134c, attached to the triggering handle 100a via the hinged attachment bracket 146, may be pivoted and maintained at a desired angle (via the hinge 148). For example, the user's view of the display screen (152) of the mobile device 114 may be improved, and a dorsally mounted peripheral 142 (e.g., a 3D/IR imager set into the dorsal face of the mobile device 114) may be aimed at a subject and activated (154), e.g., by actuation of the trigger 106 and/or other buttons (e.g., thumb button 140a, recessed buttons 140b-c; FIG. 4A) of the triggering handle 100a.

Figure 6A:
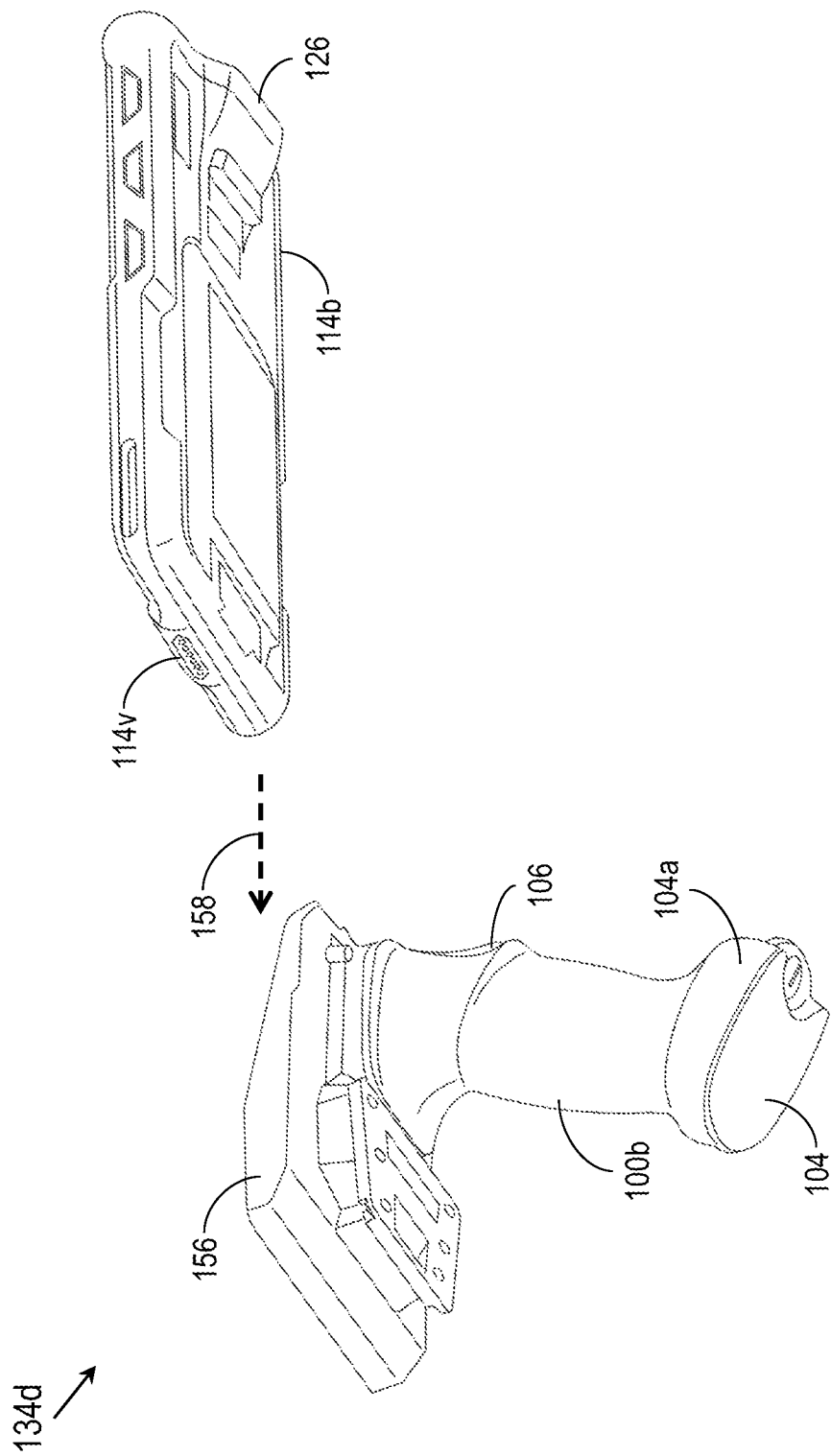
FIG. 6A is a right-side view of an exemplary embodiment of a system including a triggering handle and a mobile device according to the inventive concepts disclosed herein.
Figure 6C:
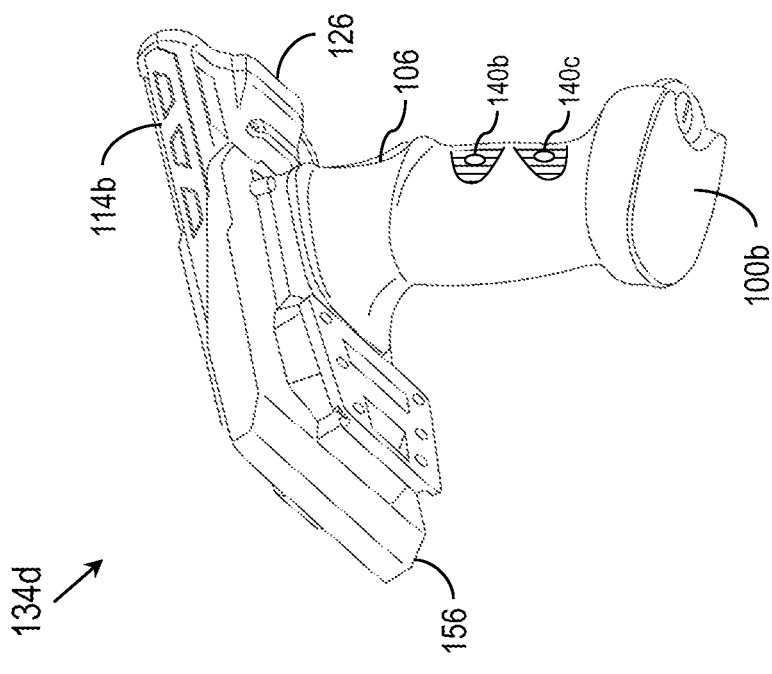
FIGS. 6B and 6C are respectively front and right-side views of the system of FIG. 6A.
Figure 6B:
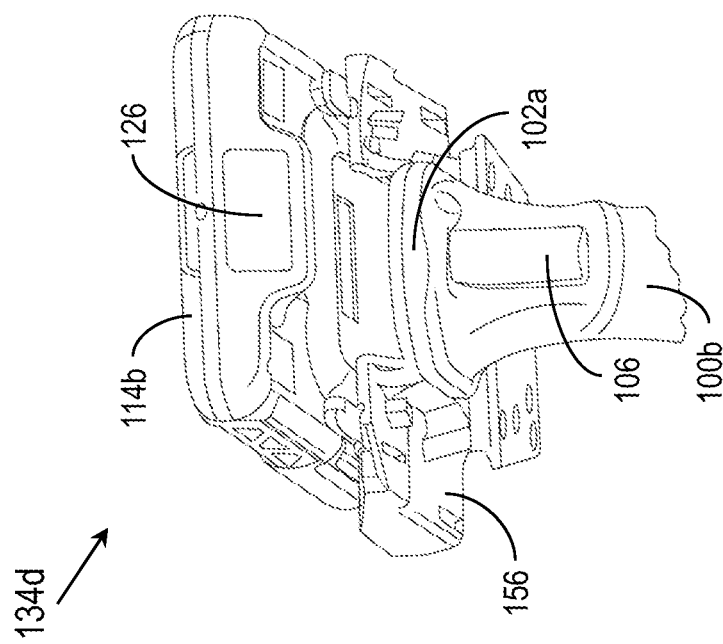

Referring to FIGS. 6A through 6C, the system 134d may be implemented and may function similarly to the systems 134a-c of FIGS. 4A-B and 5B, except that the system 134c may include a triggering handle 100b scaled to, attachable to, and wirelessly linkable to, a smartphone 114b or similarly scaled-down mobile device. For example, the triggering handle 100b may include an attachment cradle 156 sized to fit the smartphone 114b, and into which the smartphone may slidably be mounted (158). Once the smartphone 114b is mounted to the attachment cradle 156 and thereby attached to the triggering handle 100b, the triggering handle may establish a wireless link to the smartphone 114b, via which key codes may be transmitted to activate components or peripherals (126) of the smartphone according to articulation of the trigger 106 or buttons (e.g., thumb button 140a, recessed buttons 140b-c; FIG. 4A) of the triggering handle 100b. The triggering handle 100b may include surface contacts (not shown) positioned within the attachment cradle 156, via which the triggering handle 100b may establish a physical data link to the smartphone 114b by connecting to opposing surface contacts 114c (e.g., pogo pins) of the smartphone. The lower portion of the triggering handle 100b may include a battery compartment (104a) for insertion of a battery or portable power source, the battery compartment 104a accessible through the bottom surface 104. In some embodiments, the triggering handle 100b may include one or more induction coils (not shown) for wireless charging of the onboard battery power source.

Referring in particular to FIGS. 6B and 6C, the smartphone 114b may include a scanner, 3D imager, or other similar component or peripheral (126) which may be pointed and "aimed" by pointing the triggering handle 100b, with which the front (102a) of the peripheral 126 is aligned. Actuating the trigger 106 (or, alternatively, the appropriately programmed recessed button 140b-c) may transmit key codes to the smartphone 114b, receipt of which by the smartphone may activate the peripheral 126 and/or related software installed to the smartphone (e.g., scanning encoded information or capturing imagery for processing by a volume dimensioning system).

Figure 7B:
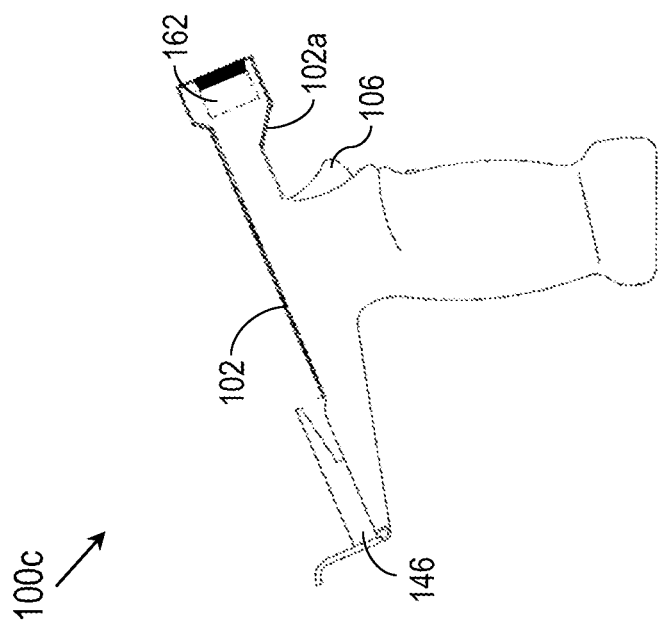
FIGS. 7A and 7B are respectively top- and right-side views of a triggering handle according to the inventive concepts disclosed herein.
Figure 7A:
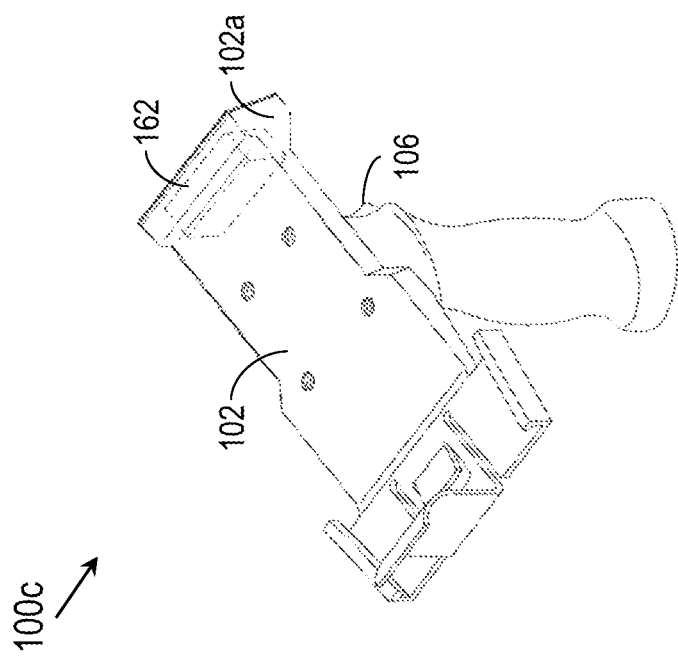

Referring to FIGS. 7A and 7B, the triggering handle 100c may be implemented and may function similarly to the triggering handle 100b of FIGS. 6A-C, except that the triggering handle 100c may include a specialized peripheral (162) embedded into the front (102a) of the top surface 102 of the triggering handle. For example, the specialized peripheral 162 may include an imager, 3D imager, or scanner mounted into the front 102a of the triggering handle 100c. Similarly to the peripheral 126 of FIG. 6B, a user may "aim" the specialized peripheral 162 at a desired subject or target by pointing the triggering handle 100c. Similarly, the user may program the trigger 106 or another button (e.g., thumb button 140a, recessed buttons 140b-c; FIG. 4A) of the triggering handle 100c to activate, via actuation of the trigger or button/s, the specialized peripheral 162 (e.g., capturing images, scanning encoded data, or opening software installed to an attached mobile device (114, FIG. 3; 114a, FIG. 6A-C) and compatible with the specialized peripheral), which may transmit the captured data stream to the attached mobile device 114. The triggering handle 100c may be physically attached, or mounted, to the mobile device 114, and the specialized peripheral 158 may be wirelessly linked thereto. Referring in particular to FIG. 7B, the triggering handle 100c may include a hinged attachment bracket 146.

Figure 8A:
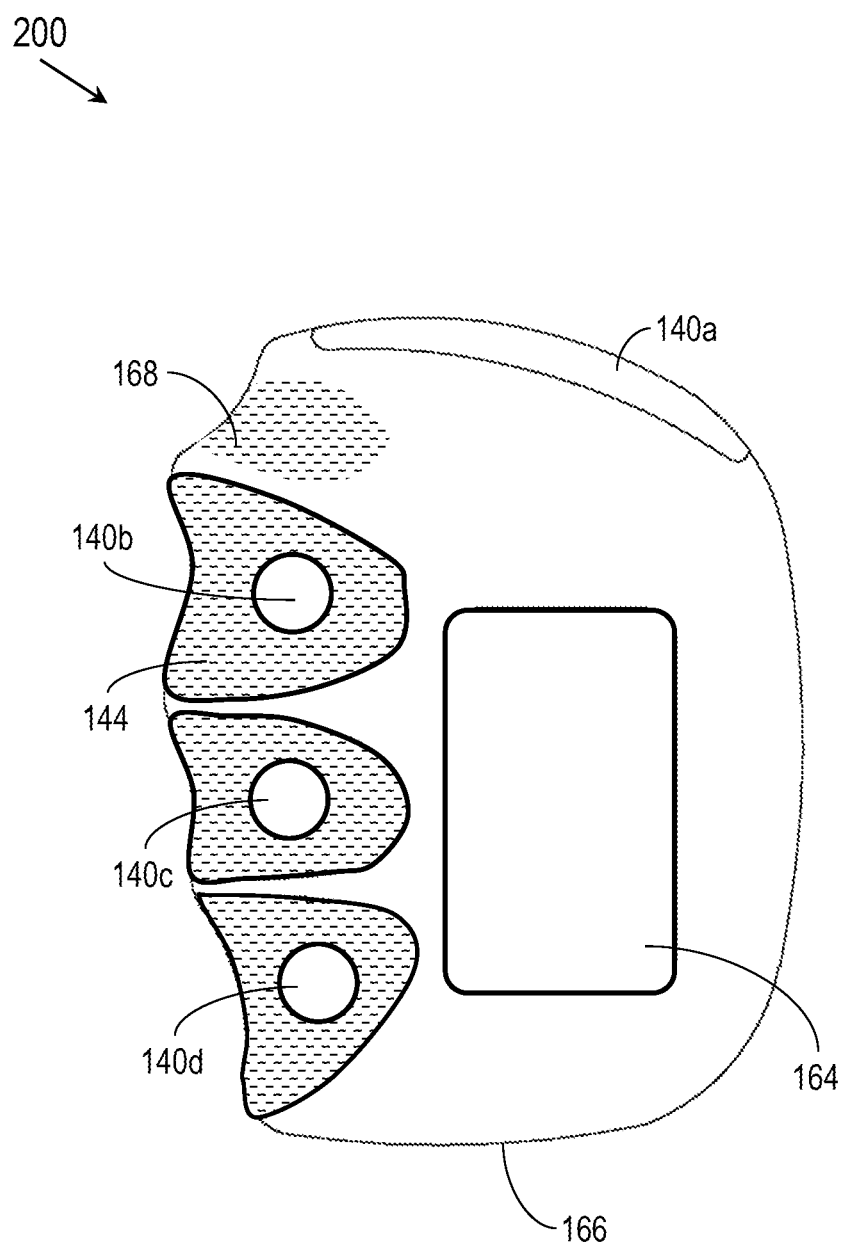
FIG. 8A is an exemplary embodiment of an enumerating device according to the inventive concepts disclosed herein.
Figure 8B:
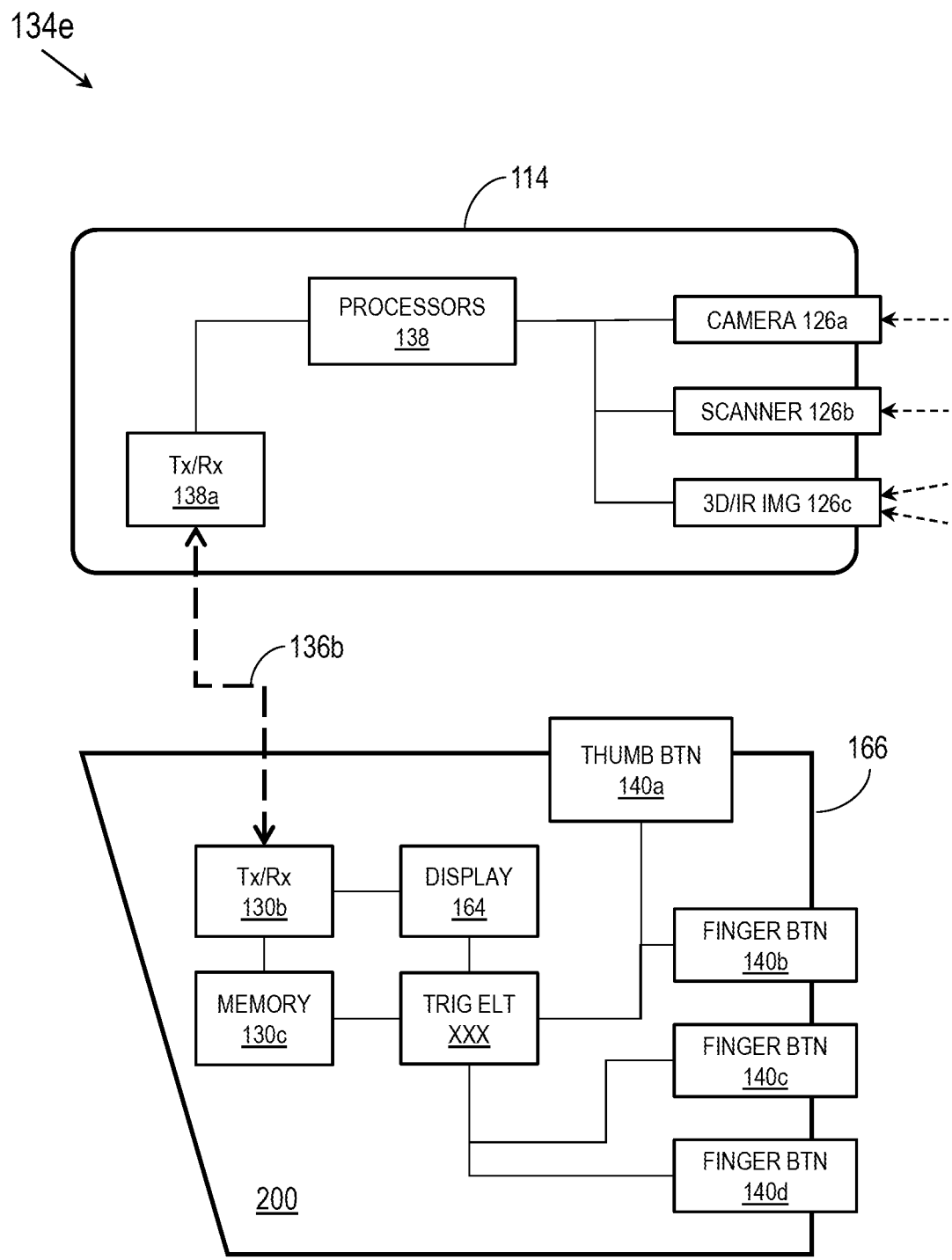
FIG. 8B is a diagrammatic illustration of the enumerating device of FIG. 8A.

Referring to FIGS. 8A and 8B, an exemplary embodiment of an enumerating device 200 according to the inventive concepts disclosed herein is shown. The system 134e as shown by FIG. 8B may be implemented and may function similarly to the system 134 of FIG. 3, except that the enumerating device 200 of the system 134e may be held in the hand of, and operated by, a user whose eyes and/or attention may be directed away from the enumerating device.

The enumerating device 200 may be fashioned of high impact materials similar to the triggering handle 100 (FIG. 1) and variably proportioned in order to optimally accommodate users of either handedness or a broad variety of hand sizes. The enumerating device 200 may include an internal battery or like power supply (not shown) and may link wirelessly to the mobile device 114, e.g., when activated via the thumb button 140a. While the enumerating device 200 may include a display screen (164) for displaying status updates related to operations of the enumerating device, functions associated with each recessed button (140a-d) of the enumerating device, or an active wireless link (136b)

between the enumerating device and the mobile device 114, it is contemplated that the enumerating device may be operated without the need for visual reference by the user to the screen 164 or to any other part of the enumerating device. Similarly, the enumerating device 200 may be operated in conjunction with the mobile device 114 without the physical attachment of the enumerating device to the mobile device.

The user, for example, may hold the enumerating device 200 in the right hand, transmitting (130b) key codes and instructions (stored to the onboard memory 130c) to trigger specific corresponding functions (e.g., software applications, camera 126a, scanner 126b, 3D/IR imager 126c) of the mobile device 114 with the thumb and/or fingers of said right hand (e.g., by actuating the thumb button 140a and recessed buttons 140b-d, corresponding to the right index, middle, and little fingers respectively). Each of the thumb and recessed buttons 140a-d may be configured or programmed (e.g., via the linked mobile device 114) to transmit (130b) specific key codes, instructions, or sets and sequences thereof to the mobile device, thereby activating particular software applications and/or peripherals (126a-c) of the mobile device.

Similarly to the recessed buttons 140b-c shown by FIG. 4A, the recessed buttons 140b-d may be recessed (144) into the outer housing (166) of the enumerating device 200 to prevent the user from too easily inadvertently actuating the wrong button. The recesses 144 may support the fingers of the user's hand in a non-actuating position that allows for rapid actuation of the appropriate recessed buttons 140b-d by the appropriate fingers without visual reference. Alternatively, a right-handed user may hold the enumerating device 200 in the right hand, rest the right index finger in a recession (168) of the outer housing 164 and the thumb atop the thumb button 140a, and actuate the recessed buttons 140b-d via simple articulation of the middle, ring, and little fingers respectively (rather than the index, middle, and ring fingers). In this way, the user may use the enumerating device 200 to efficiently execute large sets of repetitive tasks in conjunction with the mobile device 114 without visual reference to the enumerating device, e.g., counting several categories of objects, while the other hand is free to execute other tasks or operate other devices.

The enumerating device 200 may be similarly fashioned to accommodate a left-handed user. Alternatively, the enumerating device 200 may be fashioned for ambidextrous use, including a set of recessed buttons 140b-d and a display screen 162 on either side, and thus contoured and alternatively configurable for use in either hand. A user may initialize the enumerating device 200 (e.g., upon activation of the enumerating device via the thumb button 140a) by selecting right- or left-handedness, whereby the set of recessed buttons 140b-d contoured to the preferred hand remains active and configurable, while the opposing set of recessed buttons (and the opposing display screen 164) are rendered inert for that session.

Figure 9:
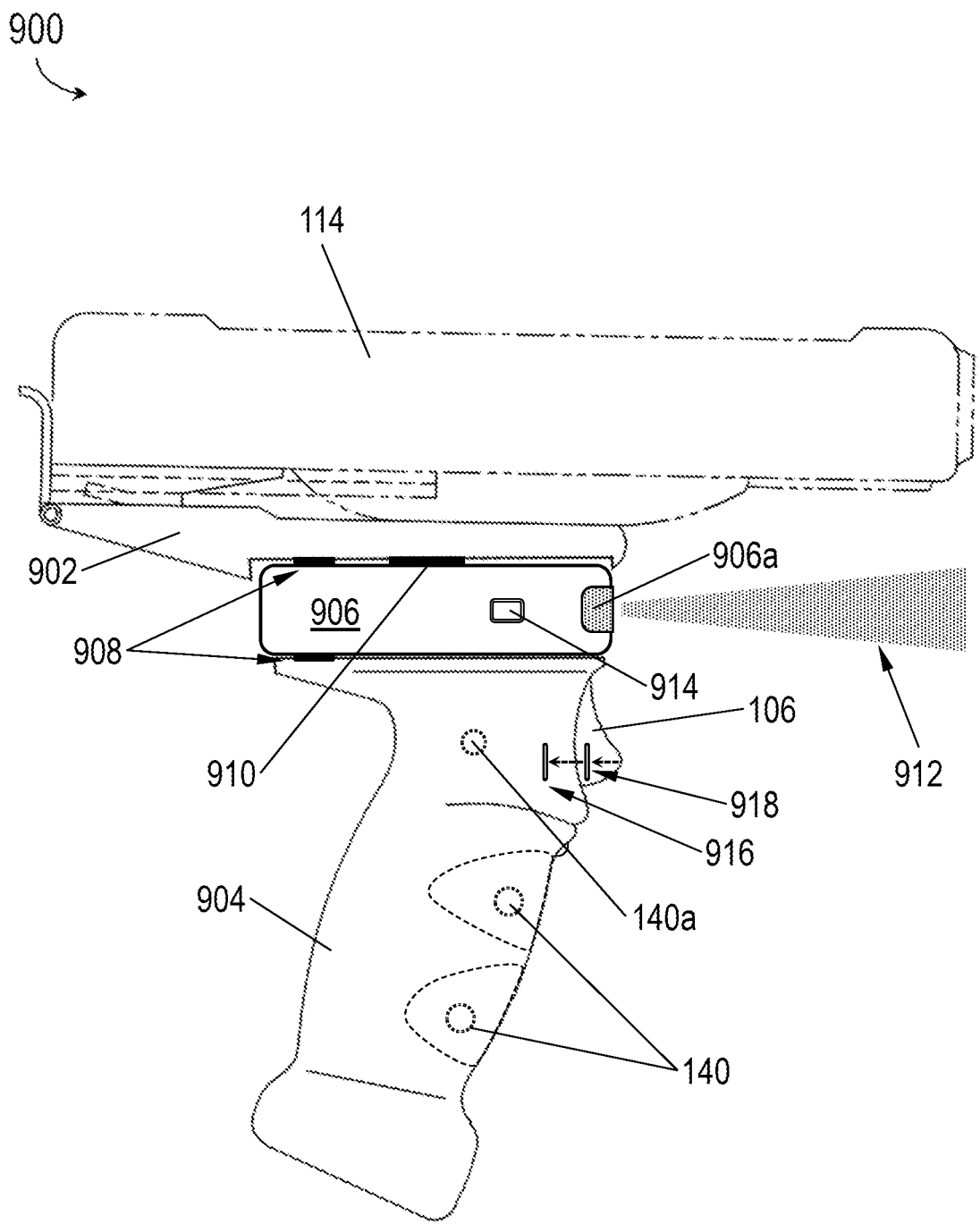
FIG. 9 is a right-side profile illustration of a multi-sensor triggering handle incorporating modular peripheral sensing devices according to embodiments of the inventive concepts disclosed herein.

Referring now to FIG. 9, the triggering handle 900 may be implemented and may function similarly to the triggering handles 100, 100a-c of FIGS. 1 through 7B, except that the triggering handle 900 may comprise an upper portion 902 (e.g., cradle portion) and lower portion 904 (e.g., handle portion) physically attachable to (and detachable from) each other.

In embodiments, the triggering handle 900 may incorporate, between the upper portion 902 and lower portion 904, one or more peripheral sensing modules 906 attachable between the lower portion and upper portion and operable via the trigger 106 or via auxiliary buttons 140 (e.g., recessed buttons, additional buttons, thumb button 140a) according to, e.g., Bluetooth. Bluetooth Low Energy (BLE), near field communication (NFC), or any other appropriate short-range wireless protocol. (It should be noted that if the triggering handle 900 is configured for right-hand use (e.g., For example, the mobile device 114 secured to the upper portion 902 may not physically incorporate one or more desired built-in peripherals (126, FIG. 3A); e.g., barcode or other scanners, imaging devices (e.g., 2D cameras, 3D/IR cameras), card readers, or any other like peripheral sensing devices or components. Accordingly, each peripheral sensing module 906 may incorporate a barcode scanner, camera, card reader, or other like peripheral component.

In embodiments, the upper portion 902 and lower portion 904 may be mutually attached via paired physical connectors 908. Similarly, each peripheral sensing module 906 may similarly incorporate paired physical connectors 908, such that the upper portion 902 may attach to the upper surface or top side of the peripheral sensing module, which may in turn attach (via the underside of the peripheral sensing module) to the upper surface of the lower portion 904. For example, the physical connectors 908 may be oriented such that the upper portion 902 and lower portion 904, and any peripheral sensing modules 906 installed therebetween, are capable of secure attachment to each other in only a single correct configuration or orientation (e.g., any installed peripheral sensing modules will be aligned with the orientation of the triggering handle 900). In some embodiments, the physical connectors 908 may allow the serial attachment of two, three, or more peripheral sensing modules 906 between the upper portion 902 and lower portion 904, in any desired sequence (as described in greater detail below).

In some embodiments, peripheral sensing modules 906 may further connect to the upper portion 902 or lower portion 904 (or both) via electrical connectors 910. For example, electrical connectors 910 may supply operating power to the peripheral sensing module 906 (e.g., via an onboard battery or power source of the triggering handle 900); in some embodiments, the electrical connectors may supplement wireless connectivity between the peripheral sensing module 906 and the mobile device 114 by providing a physical link to the mobile device 114.

In embodiments, the peripheral sensing module 906 may be activated (e.g., triggered) by operating the trigger 106 or an auxiliary button 140. For example, depressing the trigger 106 or an auxiliary button 140 may activate key codes configured to wirelessly initiate a scanning operation (912) and/or activate a sensing element (906a; e.g., barcode scanner) of the peripheral sensing module 906. Similarly, to the LED 122 of the handle device 900, each peripheral sensing module 906 may include a status indicator 914, e.g., an LED configured to activate when the peripheral sensing module is active.

In some embodiments, key codes stored to the memory (130c, FIG. 3B) of the triggering handle 900 may be preprogrammed to activate a particular peripheral sensing module 906 via a particular auxiliary button 140. For example, key codes may provide that the upper auxiliary button 140 is assigned to control the first peripheral sensing module 906 attached between the upper portion 902 and lower portion 904; should an additional peripheral sensing module be added, the lower auxiliary button may be assigned to control the additional peripheral sensing module.

In some embodiments, the trigger 106 may be a multi-stage trigger capable of multiple functions. For example, the trigger 106 may have a default state and a fully retracted state 916 (e.g., active trigger state) as described above. However, the trigger 106 may be positionable in an intermediate state 918 between the default and fully retracted states; when held in the intermediate state 918, e.g., for a predetermined amount of time, different key codes may be transmitted for execution by the mobile device 114 and/or peripheral sensing module 906.

Figure 10:
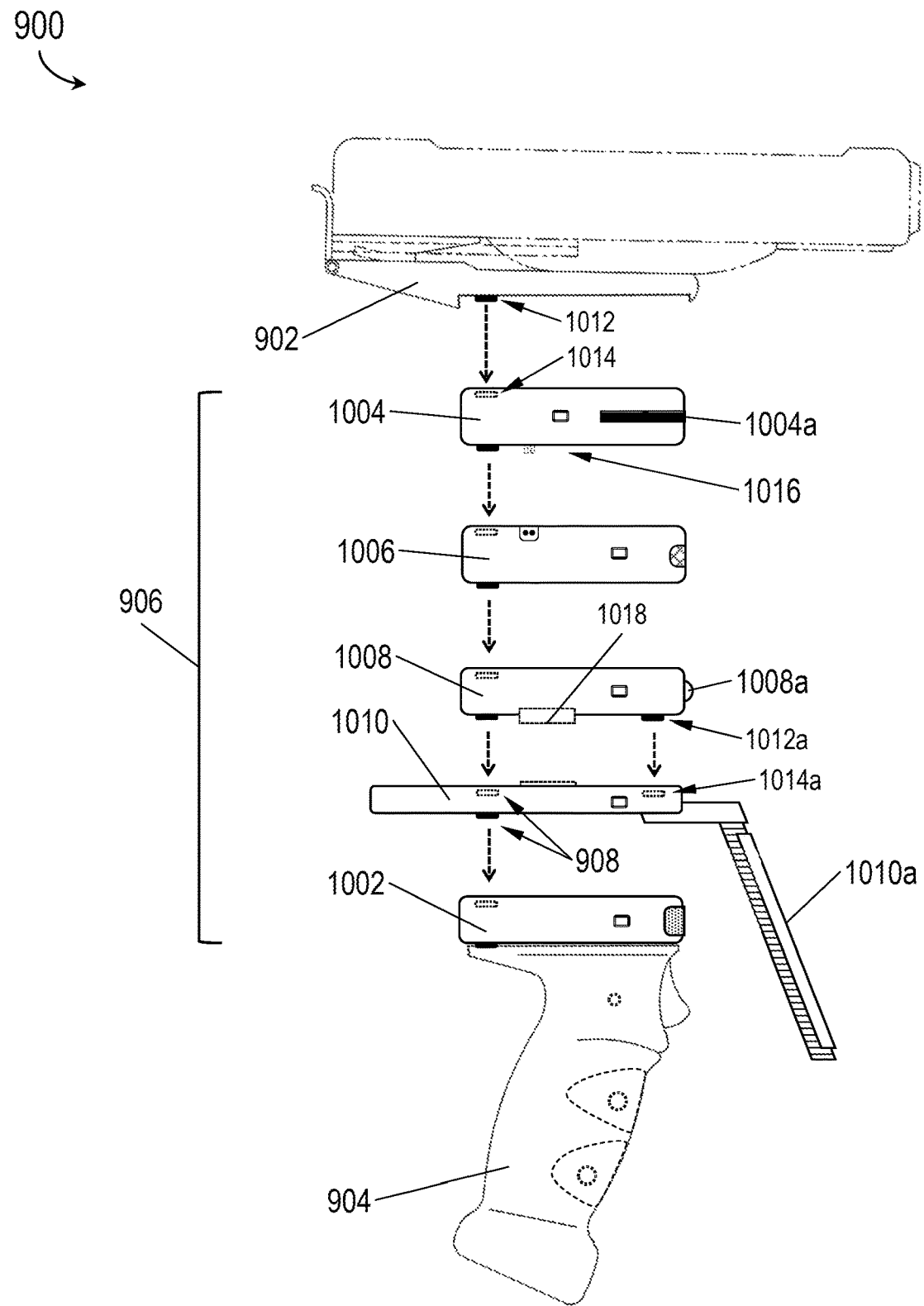
FIG. 10 is an exploded view of the multi-sensor triggering handle and modular peripheral sensing devices of FIG. 9.
Figure 11:
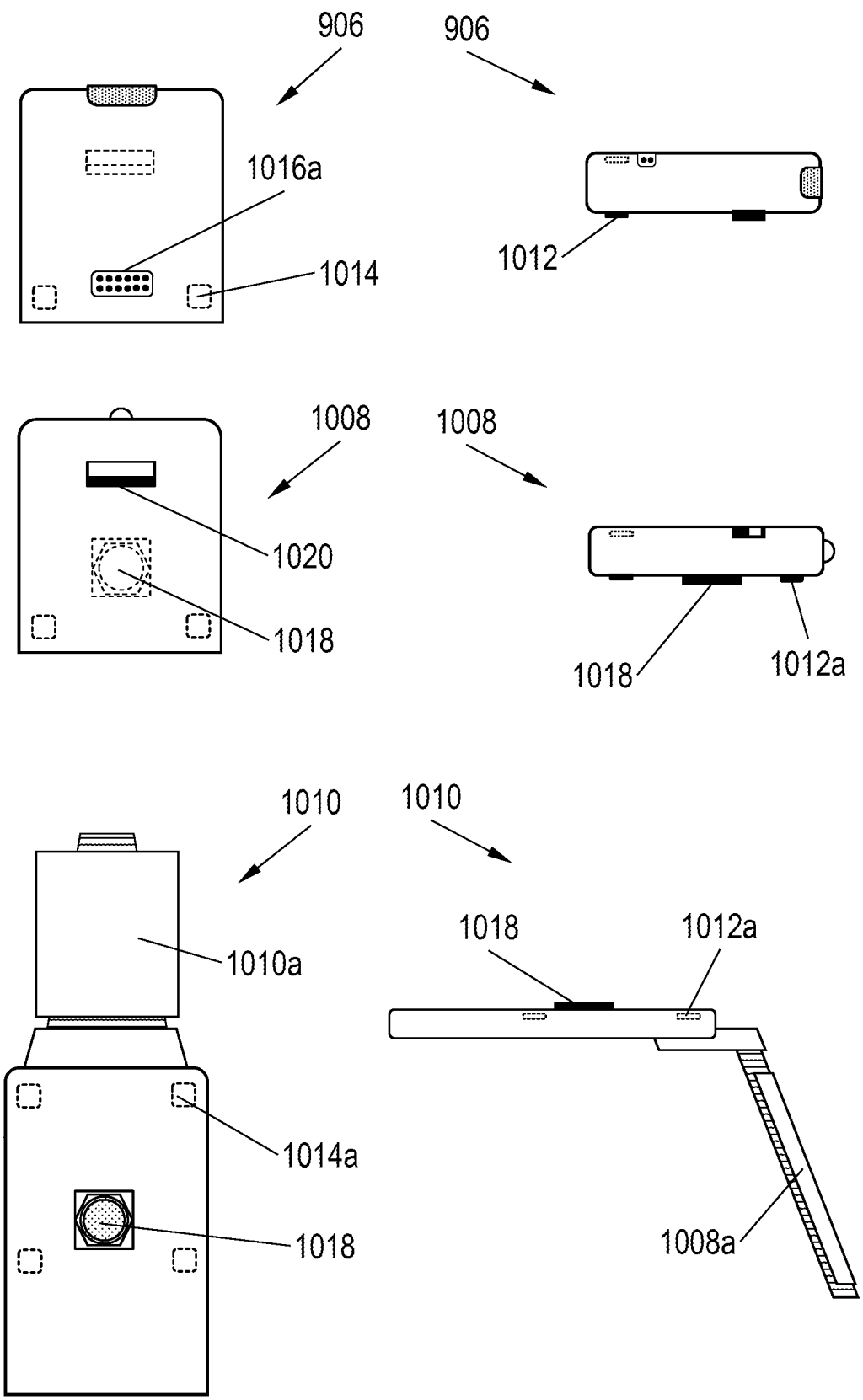
FIG. 11 illustrates overhead and profile views of the modular peripheral sensing devices of FIGS. 9 and 10.

Referring now to FIGS. 10 and 11, the triggering device 900 is shown.

In some embodiments, the peripheral sensing module 906 attached to the lower portion 904 may be a barcode scanner 1002, and other peripheral sensing modules may be serially attached between the barcode scanner 1002 and the upper portion 902. For example, additional peripheral sensing modules may include, but are not limited to: payment card readers 1004 (e.g., configured to read data from a magnetic stripe or embedded integrated circuit chip of a payment card inserted into a slot 1004a); 3D/IR imagers 1006 or other cameras/imaging devices; illuminators 1008 (e.g., including a wide-angle and/or diffused LED 1008a capable of illuminating an area directly proximate to the triggering handle 900; and RFID readers 1010 (including RFID antenna 1010a).

In some embodiments, physical connectors 908 may comprise a set of tabs 1012 set into the underside of each peripheral sensing module 906 (e.g., as well as the upper portion 902 of the triggering handle 900) and a corresponding set of snap points 1014 set into the upper surface or upper side of each peripheral sensing module (e.g., as well as the lower portion 904 of the triggering handle). For example, the tabs 1012 may configured to secure to the snap points 1014 (e.g., via spring-loading, sliding laterally into a secure position, or any like means of connection) and hold two adjacent peripheral sensing modules 906 together until detached from each other. A peripheral sensing module 906 may include a pair of tabs/snap points 1012, 1014 (e.g., at the rear, relative to the orientation of the triggering handle 900) or, in some embodiments, may include an additional pair of tabs/snap points (1012a, 1014a) toward the front. In some embodiments, electrical connectors 910 may include, but are not limited to, pogo pins 1016 (and corresponding slots 1016a), or (e.g., if a more robust physical data link is needed or desired) a coaxial 1018, USB port (1020), flexible cord/cable, or other like power/data connector. In some embodiments, the peripheral sensing modules 906 may be connected, e.g., via a USB port 1020, to external power sources and/or computing devices.

Figure 12A:
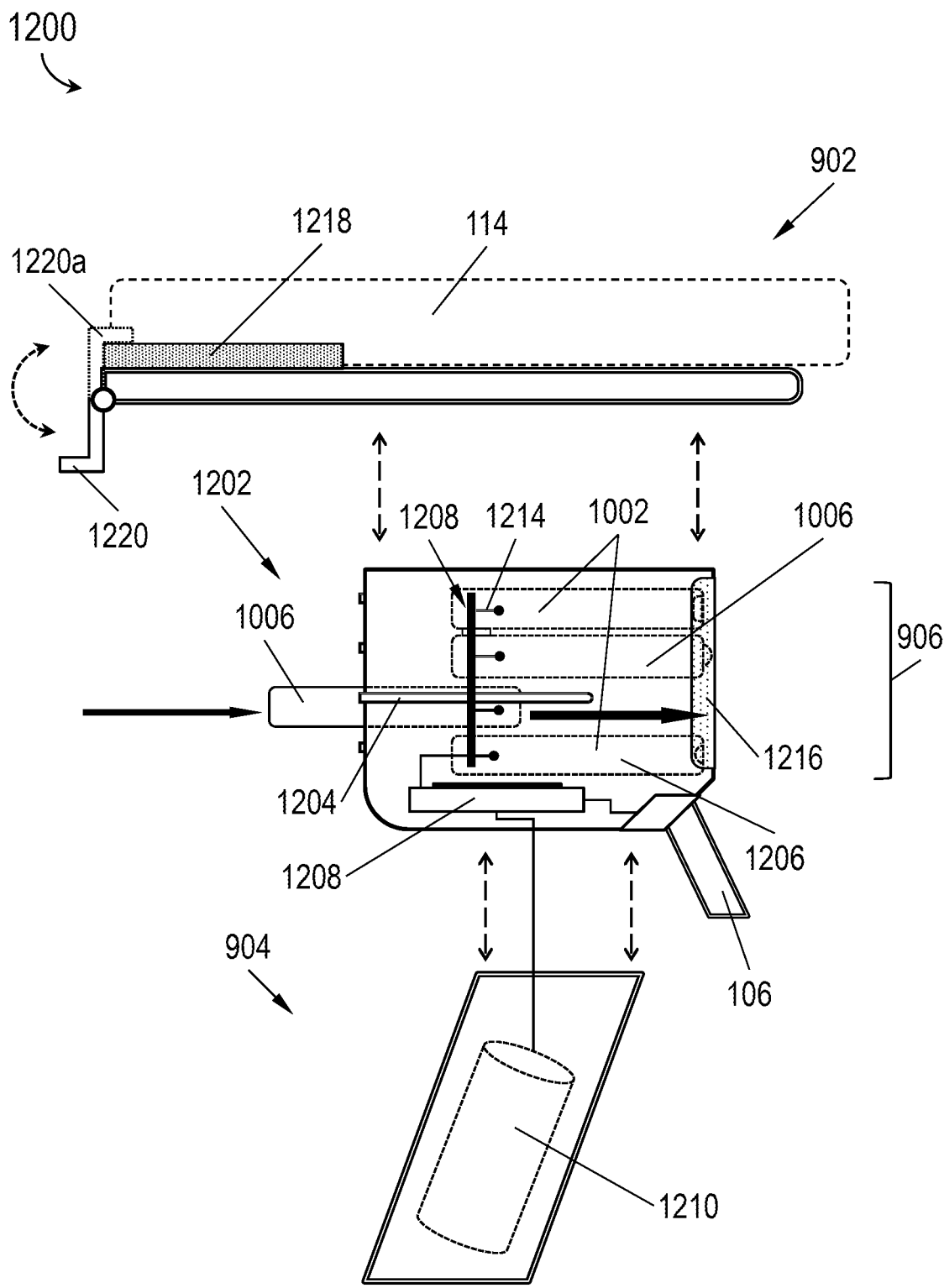
FIGS. 12A and 12B are diagrammatic illustrations of a multi-sensor triggering handle incorporating a module housing for peripheral sensing modules according to embodiments of the inventive concepts disclosed herein.

Referring to FIG. 12A, the triggering handle 1200 may be implemented and may function similarly to the triggering handle 900 of FIGS. 9 through 11, except that the triggering handle 1200 may incorporate a module housing 1202 to which the upper portion 902 and lower portion 904 may be attached.

In embodiments, the module housing 1202 may provide for the installation and removal of peripheral sensing modules 906 as well as power and control functionality. For example, the module housing 1202 may house the trigger 106 as well as multiple slots or brackets 1204 into which barcode scanners 1002, illuminators 1008, 3D/IR imagers 1006, laser measurement units 1206, payment card readers (1004, FIG. 10), RFID readers (1010, FIG. 10), and any other appropriate peripheral sensing modules may be mounted (e.g., and secured into place until removed from the module housing).

In embodiments, the module housing 1202 may include a control module 1208, e.g., an onboard processor or integrated circuit (IC) configured for power and control management of any peripheral sensing modules 906 currently installed within the control module. For example, the control module 1208 may be powered by an onboard battery 1210 or other like rechargeable power source (e.g., situated within the lower portion 904 and described in greater detail below), which may provide operating power for installed peripheral sensing modules 906. In embodiments, the control module 1208 may manage wireless connectivity (e.g., via Bluetooth, WiFi, NFC, or any other like wireless protocol) to any mobile devices 114 mounted to the upper portion 902.

In embodiments, the module housing 1202 may include a control bus 1212 linked to electrical connectors 910 (e.g., serial, USB) and providing wired communications links 1214 to each installed peripheral sensing module 906. (Selected peripheral sensing modules 906, depending on the particular type of module, may wirelessly connect to the control module 1208 and be controlled thereby, e.g., via the trigger 106 housed within the module housing).

In embodiments, the module housing 1202 may include one or more forward windows or portals 1216. For example, the windows or portals 1216 may be open, transparent, translucent, or otherwise configured to allow any peripheral sensing devices 906 to operate at full capacity. Transparent or translucent windows or portals 1216 may provide impact protection to any sensitive external components of the peripheral sensing devices 906.

In embodiments, the upper portion 902 may include snap rails 1218 for securing mobile devices 114 mounted to the upper portion. For example, the mobile device 114 may be locked into the snap rails 1218 by a release lever 1220 (e.g., the release lever may swing upward (1220a) to lock the mobile device in place, and downward to release the mobile device from the snap rails).

Figure 12B:
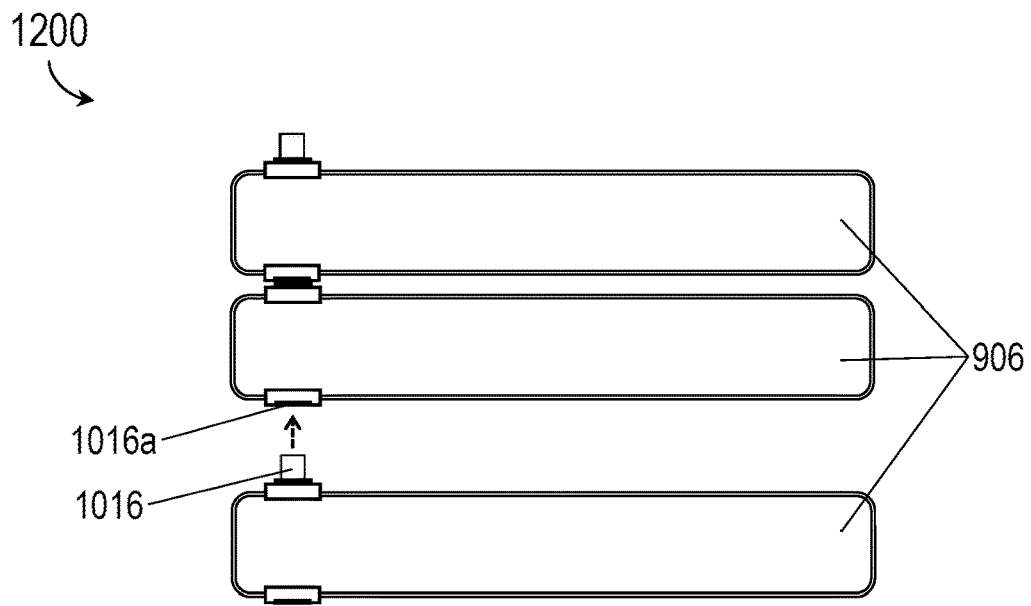

Referring also to FIG. 12B, in some embodiments adjacent peripheral sensing modules 906 may additionally maintain surface contacts via rear-mounted electrical connectors (910, FIG. 9). For example, each peripheral sensing module 906 may incorporate a set of pogo pins 1016 on or near the back of its top side and a corresponding set of slots 1016a on or near the back of its underside (or, e.g., the pogo pins may be situated on the underside and the slots on the top side), such that power, grounding, and/or communications connectivity is provided (e.g., in addition to the control bus 1212) by electrical connectors 910 between each adjacent pair of peripheral sensing modules.

Figure 13:
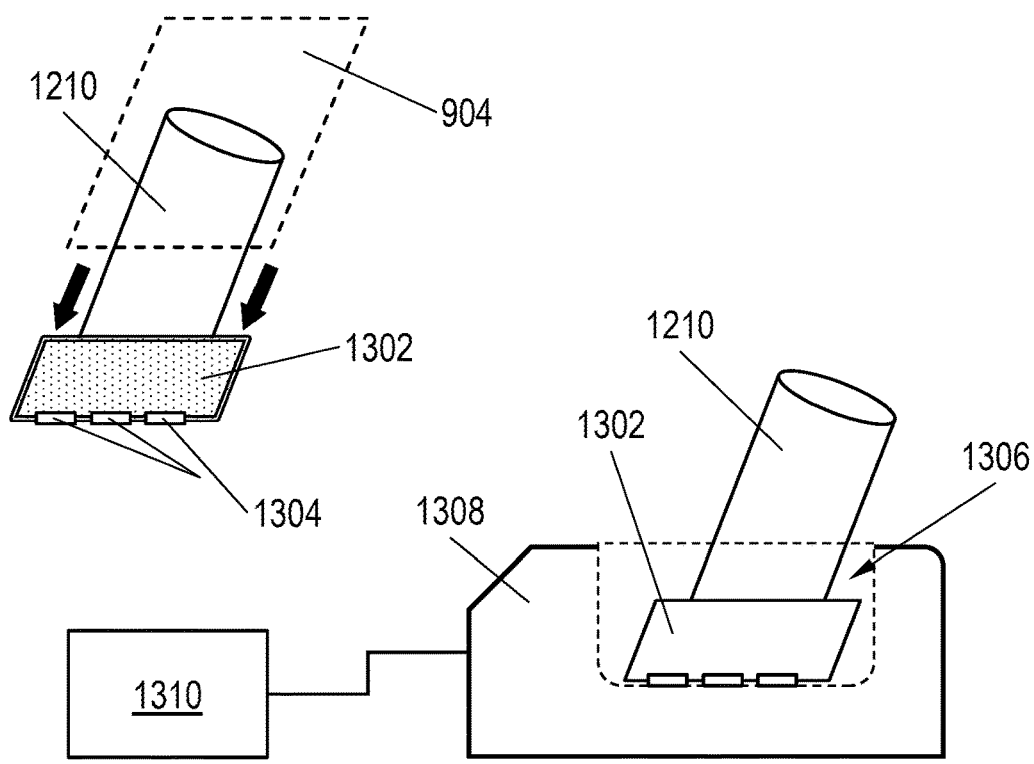
FIG. 13 is a diagrammatic illustration of an onboard power management system for the triggering handles of FIGS. 9 through 12B.

Referring now to FIG. 13, in some embodiments the onboard battery 1210 may be detachable from the lower portion 904. For example, the onboard battery 1210 and the base 1302 of the lower portion 904 may be removable from the rest of the lower portion. In some embodiments, the base 1302 may include electrical contacts 1304, such that the onboard battery 1210 may be inserted into a cradle 1306 of a charging device 1308 connectable to a power supply 1310 (e.g., standard AC power supply) to recharge the battery. For example, either the detached onboard battery 1210 and base 1302 may be inserted into the cradle 1306, or the entire triggering handle (1200, FIG. 12A; e.g., with integrated onboard battery) may be inserted into the cradle.

Figure 14A:
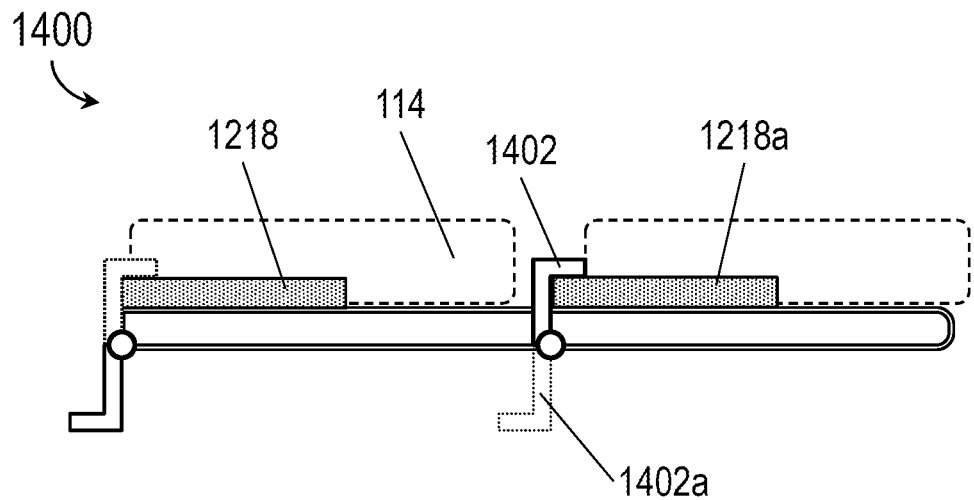
FIGS. 14A-B are diagrammatic illustrations of variant upper portion docking mechanisms for the triggering handles of FIGS. 9 through 13.

Referring now to FIG. 14A, the upper portion 1400 may be implemented and may function similarly to the upper portion 902 of FIGS. 9 and 12, except that the upper portion 1400 may incorporate an additional snap rail 1218a forward of the snap rail 1218. For example, the mobile device 114 may be locked into the forward snap rail 1218a (e.g., and released therefrom) via a side-mounted release lever 1402 (also having a down position 1402a).

Figure 14B:
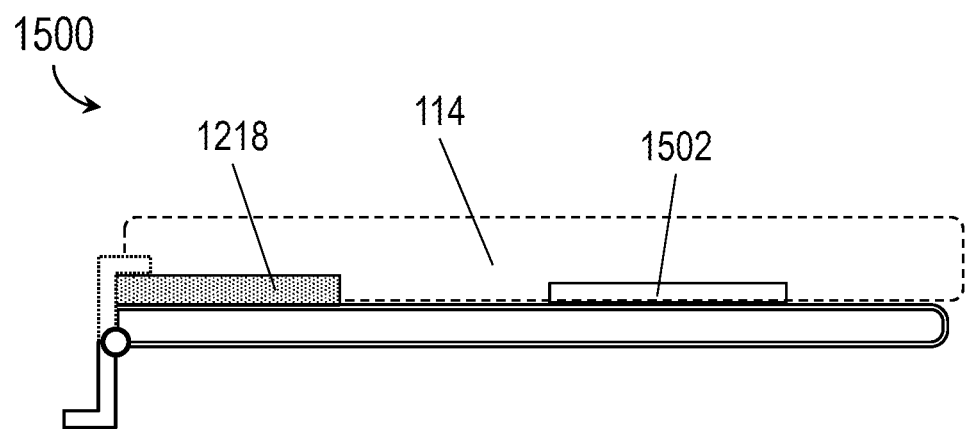

Referring also to FIG. 14B, the upper portion 1500 may be implemented and may function similarly to the upper portions 902, 1400 of FIGS. 9 through 14, except that the upper portion 1500 may include an alignment slot 1502 forward of the snap rail 1218. For example, the forward snap rail 1218a and/or alignment slot 1502 may provide additional stability for the mounted mobile device 114 or, in some embodiments, may provide the mounting of an additional mobile device 114a to the upper portion 1400, 1500.

We claim:

1. A ruggedized handle device for a modular mobile sensing system, comprising:
   an outer shell fashioned of a high impact material and enclosing an inner shell fashioned of the high impact material,
   the outer shell comprising an upper portion removably attached to a lower portion via at least one physical attachment component,
   the lower portion at least partially contoured to a hand of a user,
   the upper portion configured to securely support a mobile computing device,
   at least one memory disposed within the outer shell and configured to store one or more encoded instructions associated with the mobile computing device;
   at least one triggering element disposed within the inner shell and coupled to the at least one memory, the triggering element configured to:
      establish a wireless link to the mobile computing device according to at least one wireless protocol; and
      transmit the one or more encoded instructions to the mobile computing device when the handle device is in an active state;
   a trigger corresponding to an index finger of the hand and capable of actuation by the index finger, the actuation configured to initiate the active state;
   one or more peripheral sensor modules configured to be serially attachable between the lower portion and the upper portion,
   the physical attachment component configured to be connected to one of the one or more peripheral sensor modules;
   the upper portion and lower portion configured to be connected to the one or more peripheral sensors configured to be connected in series to each other, wherein the outer shell is configured to provide operating power in series to the one or more peripheral sensors via at least one electrical connector of one or more electrical connectors, each electrical connector of the one or more electrical connectors configured to power an adjacent peripheral sensor module of the one or more peripheral sensor modules connected in series; and
   wherein the at least one physical attachment component includes at least one hinged attachment bracket configured to pivot the mobile computing device toward the user.

2. The ruggedized handle device of claim 1, wherein:
   the upper portion includes at least one docking component configured to removably secure the mobile computing device to the handle device, the at least one docking component configured to pivot the mobile computing device relative to the handle device.

3. The ruggedized handle device of claim 1, wherein:
   the one or more peripheral sensor modules are selected from a group including:
   an imaging device;
   a barcode scanner configured to detect and decode encoded information;
   a card reader device configured to accept a payment card and read data from the payment card;
   an illuminator including one or more luminous elements configured to illuminate an area proximate to the handle device;
   or
   an RFID reader including an RFID antenna.

4. The ruggedized handle device of claim 1, wherein the mobile computing device includes at least one of a tablet, a smartphone, and a portable computing device.

5. The ruggedized handle device of claim 1, wherein the lower portion further comprises:
   one or more auxiliary buttons selected from a group including:
   a first auxiliary button corresponding to a non-index finger of the hand;
   and
   a second auxiliary button corresponding to a thumb of the hand;
   each auxiliary button embedded within a recess set into the outer shell, the recess surrounding the auxiliary button and configured to support at least one of the non-index finger and the thumb in a non-actuating position proximate to the button;
   and
   each auxiliary button configured for one of:
   initiating the active state;
   or
   operating an attached peripheral sensor module.

6. The ruggedized handle device of claim 1, wherein:
   the trigger includes at least one magnetic element having at least a resting position within the outer shell and an active position proximate to the triggering element, the actuation configured to initiate the active state by moving the magnetic element into the active position.

7. The ruggedized handle device of claim 1, wherein:
   the trigger has a default state;
   the trigger is positionable in a fully retracted state and at least one intermediate state between the default state and the fully retracted state; the trigger configured for:
   when in the fully retracted state, at least one of 1) initiating the active state and 2) transmitting an auxiliary instruction executable via one of the mobile computing device and the one or more peripheral sensor modules;
   and
   when in the at least one intermediate state, transmitting the at least one auxiliary instruction.

* * * * *